(12) United States Patent
Ren

(10) Patent No.: US 10,192,078 B2
(45) Date of Patent: Jan. 29, 2019

(54) INTEGRATED CIRCUIT, DIAGNOSTIC SYSTEM AND DIAGNOSTIC METHOD

(71) Applicant: SOCIONEXT INC., Yokohama-shi, Kanagawa (JP)

(72) Inventor: Jialin Ren, Kawasaki (JP)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 15/084,212

(22) Filed: Mar. 29, 2016

(65) Prior Publication Data

US 2016/0300083 A1 Oct. 13, 2016

(30) Foreign Application Priority Data

Apr. 10, 2015 (JP) .................................. 2015-081054

(51) Int. Cl.
*G06K 7/00* (2006.01)
*G01R 31/317* (2006.01)
*G01R 31/28* (2006.01)

(52) U.S. Cl.
CPC ..... *G06K 7/0095* (2013.01); *G01R 31/31721* (2013.01); *G01R 31/2822* (2013.01)

(58) Field of Classification Search
CPC ............. G06K 7/0095; G06K 19/0722; G06K 7/10158; G01R 31/31721; G01R 31/2822
USPC ....................................................... 340/10.1
See application file for complete search history.

(56) References Cited

U.S. PATENT DOCUMENTS 5,410,315 A * 4/1995 Huber ................... G01S 13/753
340/10.3

5,541,604 A * 7/1996 Meier ................... G01S 13/758
342/42
2006/0276987 A1* 12/2006 Bolander ........... G06K 7/10059
702/106
2007/0220737 A1* 9/2007 Stoughton ........ G01R 31/31723
29/593
2008/0297320 A1* 12/2008 Kawae ............... G06K 19/0701
340/10.1
2009/0045832 A1* 2/2009 Brandl ............... G01R 31/3025
324/754.31

(Continued)

FOREIGN PATENT DOCUMENTS

| JP | H10-339765 A | 12/1998 |
|----|--------------|---------|
| JP | 2001-266596 A | 9/2001 |
| JP | 2005-030877 A | 2/2005 |

(Continued)

OTHER PUBLICATIONS

Japanese Office Action of related Japanese Patent Application No. 2015-081054 dated Oct. 9, 2018.

*Primary Examiner* — Edwin Holloway, III
(74) *Attorney, Agent, or Firm* — Arent Fox LLP

(57) ABSTRACT

An integrated circuit is one that performs radio communication with an external apparatus and includes a processing circuit, a diagnostic circuit configured to perform a diagnosis of the processing circuit according to a plurality of diagnostic items and a charging circuit configured to store charge for causing the diagnostic circuit to operate, during a period of performing radio communication, in which the diagnostic circuit is configured to perform the diagnosis on a first subset of the plurality of diagnostic items by using the charge stored in the charging circuit during a first period of not performing radio communication.

19 Claims, 18 Drawing Sheets

(56) References Cited

U.S. PATENT DOCUMENTS

2010/0281301 A1* 11/2010 Lepek .................. H04B 5/0068
714/30
2014/0070212 A1* 3/2014 Fujiwara ............ G06K 19/0722
257/48

FOREIGN PATENT DOCUMENTS

| JP | 2005-283389 A | 10/2005 |
| JP | 2007-078407 A | 3/2007 |
| JP | 2008-204477 A | 9/2008 |
| JP | 2009-009558 A | 1/2009 |

\* cited by examiner

F I G. 1
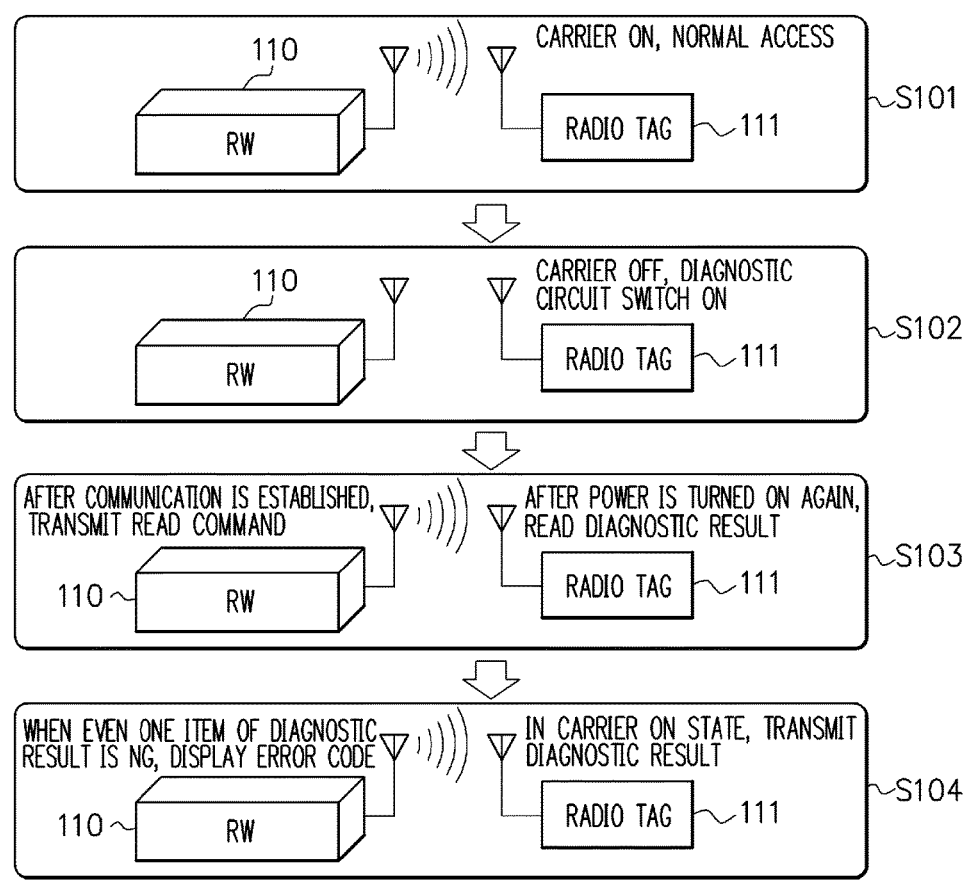

FIG. 8
| CONDITION | INPUT | OUTPUT | CONTROL CONTENTS |
|---|---|---|---|
| f1<VREF | M0=0 | N0=0 | CHARGE VDD2=>VDD1 |
| f1>VREF | M0=1 | N0=1 | CHARGING CIRCUIT IS STOPPED |
| f1<VREF | M1=00 | N1=0 | DIAGNOSTIC SECTION IS NOT OPERATED |
| f0<VREF<f1 | M1=01 | N1=1 | DIAGNOSTIC SECTION IS OPERATED |
| f0>VREF | M1=10 | N1=0 | DIAGNOSTIC SECTION IS NOT OPERATED |
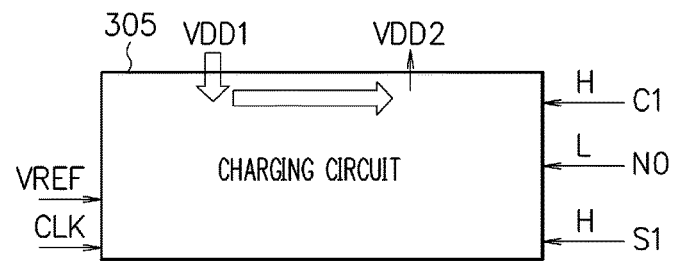
FIG. 9A
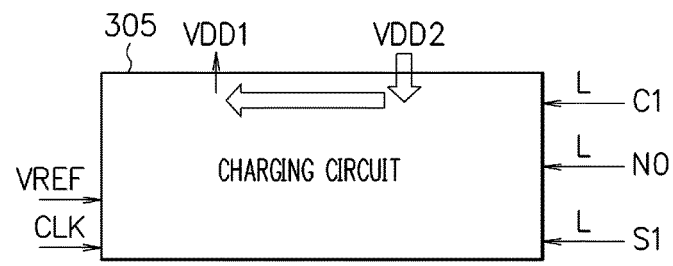
FIG. 9B
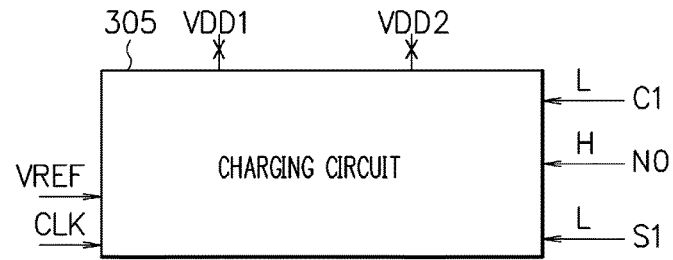
FIG. 9C F I G. 10
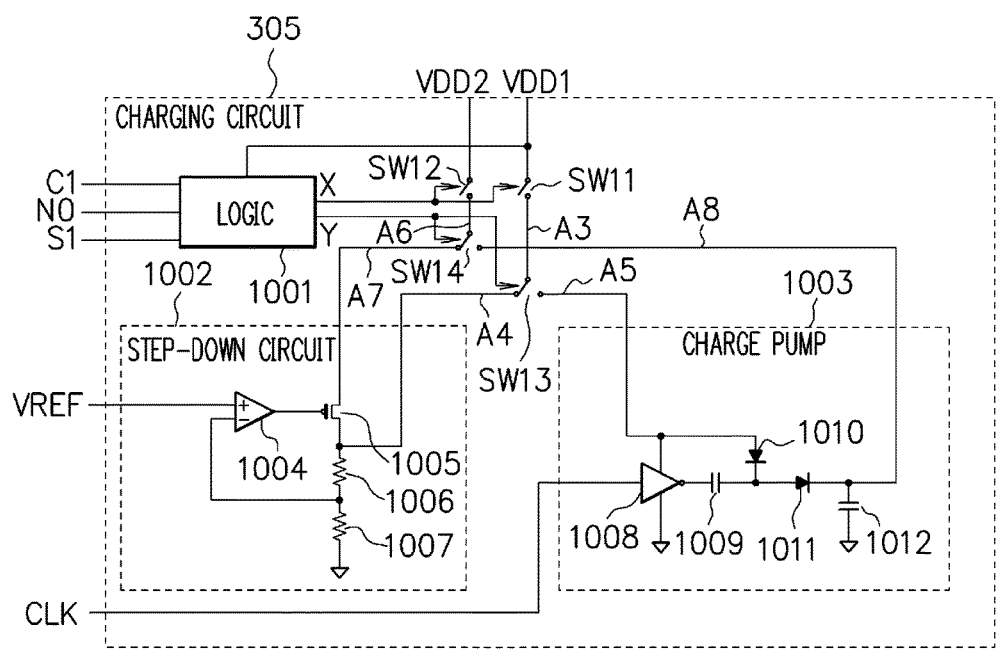

FIG. 11

| C1 | N0 | S1 | X | Y | CHARGING DIRECTION | SW OPERATION | STEP-DOWN CIRCUIT AND CHARGE PUMP OPERATION |
|---|---|---|---|---|---|---|---|
| L | L | L | H | L | VDD2⇒VDD1 | SW11 AND SW12 ARE ON, SW13 AND SW14 CONNECTED TO LEFT | STEP-DOWN CIRCUIT OPERATED, CHARGE PUMP STOPPED |
| L | L | H | L | L | NO CHARGING | SW11 AND SW12 ARE OFF, SW13 AND SW14 ARE DISABLED | BOTH STOPPED |
| L | H | L | L | L | NO CHARGING | SW11 AND SW12 ARE OFF, SW13 AND SW14 ARE DISABLED | BOTH STOPPED |
| L | H | H | L | L | NO CHARGING | SW11 AND SW12 ARE OFF, SW13 AND SW14 ARE DISABLED | BOTH STOPPED |
| H | L | L | L | L | NO CHARGING | SW11 AND SW12 ARE OFF, SW13 AND SW14 ARE DISABLED | BOTH STOPPED |
| H | L | H | H | H | VDD1⇒VDD2 | SW11 AND SW12 ARE ON, SW13 AND SW14 ARE CONNECTED TO RIGHT | STEP-DOWN CIRCUIT STOPPED, CHARGE PUMP OPERATED |
| H | H | L | L | L | NO CHARGING | SW11 AND SW12 ARE OFF, SW13 AND SW14 ARE DISABLED | BOTH STOPPED |
| H | H | H | L | L | NO CHARGING | SW11 AND SW12 ARE OFF, SW13 AND SW14 ARE DISABLED | BOTH STOPPED |

|  | CARRIER ON | | CARRIER OFF | |
|---|---|---|---|---|
|  | VDD1<1.8V | VDD1=1.8V | VDD1<1.8V | VDD1=1.8V |
| SHUNT OPERATION | SHUNT OFF | SHUNT ON | SHUNT OFF | SHUNT OFF |
| RECTIFIER OPERATION | ON | ON | OFF | OFF |
| CHARGING DIRECTION | RECTIFIER→VDD1 | RECTIFIER→VDD1 & VDD1→VDD2 | VDD1←VDD2 | NOT CHARGED |
| VDD1 CHARGING STATE | ON (RECEIVE) | ON (RECEIVE & GIVE) | ON (RECEIVE) | ON (DISCHARGE) |
| VDD2 CHARGING STATE | OFF | ON (RECEIVE) | ON (GIVE) | OFF |

F I G. 15

| CONDITION | INPUT | OUTPUT | CONTROL CONTENTS |
|---|---|---|---|
| $f1<VREF$ | $M0=0$ | $N0=0$ | CHARGE VDD2 => VDD1 |
| $f1>VREF$ | $M0=1$ | $N0=1$ | CHARGING CIRCUIT IS STOPPED |
| $f1<VREF$ | $M1=00$ | $N1=00$ | DIAGNOSTIC SECTION IS NOT OPERATED, SET [4]=L |
| $f0<VREF<f1$ | $M1=01$ | $N1=11$ | DIAGNOSTIC SECTION IS OPERATED, SET [4]=L |
| $f0>VREF$ | $M1=10$ | $N1=01$ | DIAGNOSTIC SECTION IS NOT OPERATED, SET [4]=H |

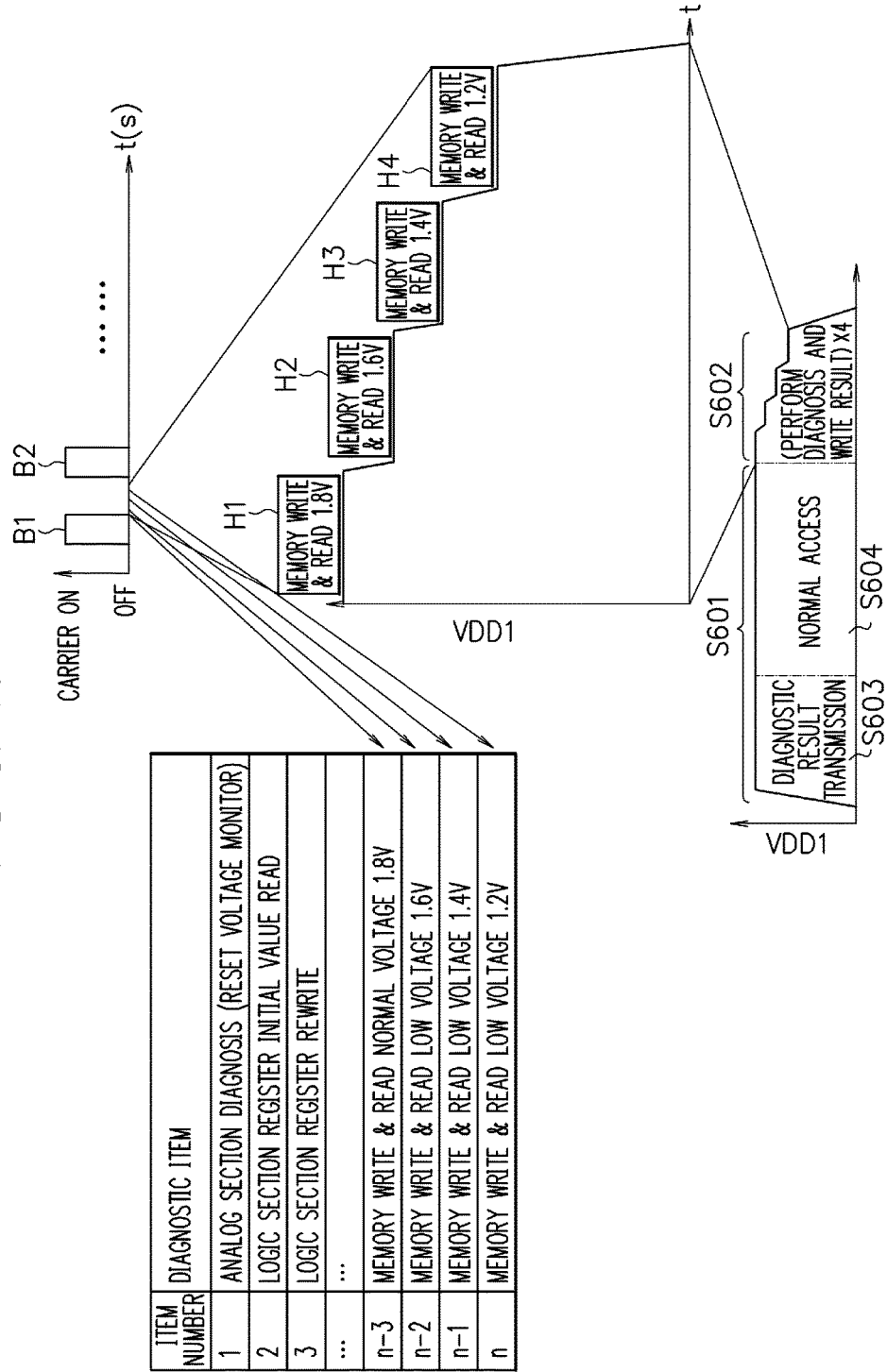
F I G. 16

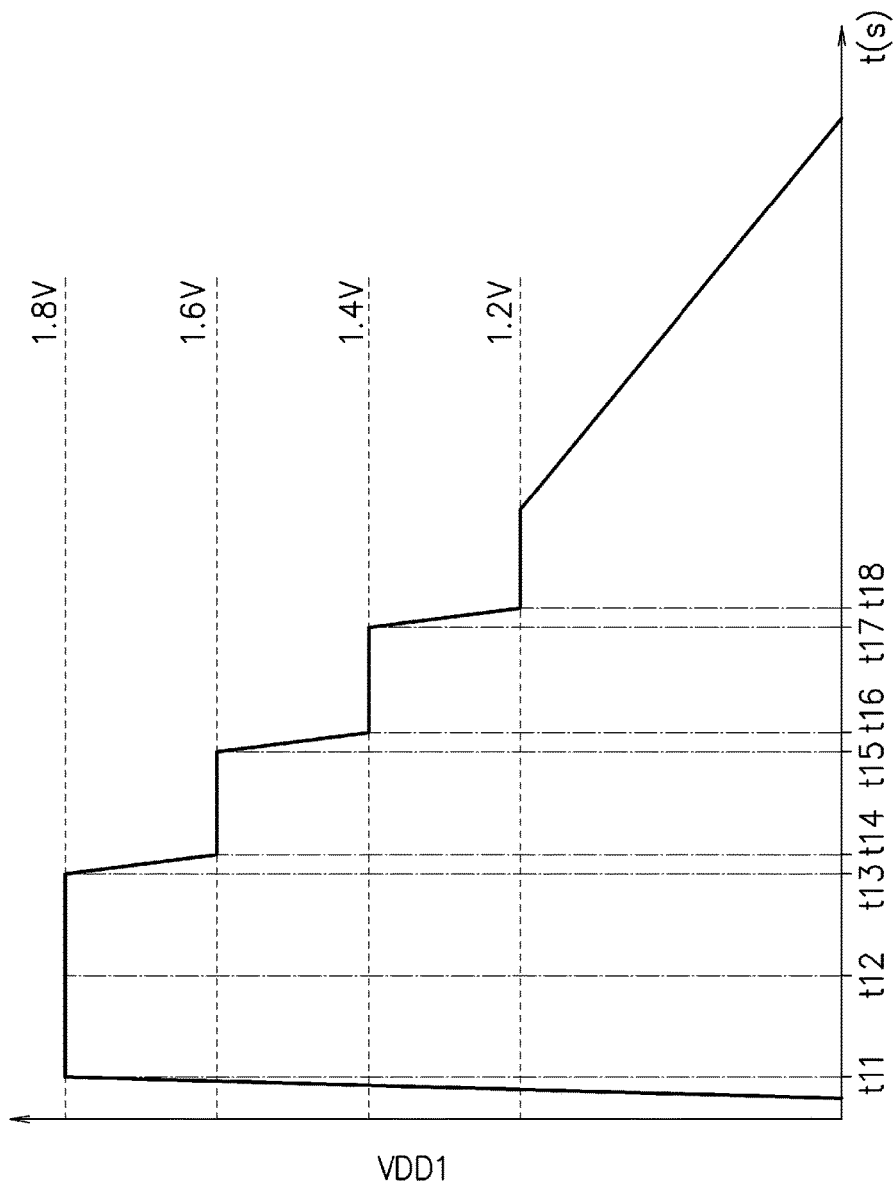
F I G. 17

INTEGRATED CIRCUIT, DIAGNOSTIC SYSTEM AND DIAGNOSTIC METHOD

CROSS-REFERENCE TO RELATED APPLICATION

This application is based upon and claims the benefit of priority of the prior Japanese Patent Application No. 2015-081054, filed on Apr. 10, 2015 the entire contents of which are incorporated herein by reference.

FIELD

The present invention relates to an integrated circuit, a diagnostic system and a diagnostic method.

BACKGROUND

A semiconductor integrated circuit apparatus is known, which includes a built-in testing circuit, an antenna and a radio communication circuit that allow communication with an external device, and a memory that records an ID code and testing results of a circuit to be tested (see Patent Document 1). A power generation circuit generates power using a carrier inputted from outside. The semiconductor integrated circuit generates power using a radio signal from outside, compares an ID code sent from outside with an own ID code, receives a command on the semiconductor integrated circuit and transmits testing results of the circuit to be tested to outside.

Furthermore, a semiconductor integrated circuit is known, which operates through an inner circuit (see Patent Document 2). The semiconductor integrated circuit includes a testing section that tests the inner circuit and a radio interface module that is electrically connected to this testing section and performs radio communication therewith.

Furthermore, a semiconductor integrated circuit including a testing circuit is known, which supplies a testing signal for testing a circuit to be tested from the testing circuit to the circuit to be tested and determines whether the circuit to be tested is good or bad based on an output signal outputted from the circuit to be tested to which the testing signal is supplied (see Patent Document 3). The semiconductor device includes a power supply capacitor that stores a predetermined amount of charge to drive the testing circuit after at least the testing circuit supplies the testing signal to the circuit to be tested until the testing circuit determines whether the circuit to be tested is good or bad.

Furthermore, a semiconductor integrated circuit is known, in which inner circuit testing means for testing a calculation processing circuit which performs predetermined calculation processing as a circuit to be tested is integrally formed with the calculation processing circuit (see Patent Document 4). The inner circuit testing means receives a time-divided testing input signal from outside, develops the testing input signal into parallel signals, inputs the parallel signals to the circuit to be tested, time-divides the testing output signal outputted from the circuit to be tested and outputs the time-divided signals to an external terminal. A first RAM stores the testing input signals parallel-developed by the inner circuit testing means and outputs these testing input signals to the circuit to be tested at a system clock frequency used during normal operation of the circuit to be tested. A second RAM can be accessed independently of the first RAM to which the testing output signal outputted from the circuit to be tested is inputted at the system clock frequency.

Furthermore, a semiconductor apparatus is known, which includes a memory circuit having a predetermined storage capacity, a testing circuit that tests the presence or absence of a defect in the memory circuit, and a power supply circuit that changes an inner supply voltage of the memory circuit (see Patent Document 5). The supply voltage control circuit is incorporated in the testing circuit and sends a control signal to change the inner supply voltage of the memory circuit to the power supply circuit. The testing control circuit is incorporated in the testing circuit, temporarily stops testing in accordance with a control signal from the supply voltage control circuit and resumes testing after the inner supply voltage changes.

Patent Document 1: Japanese Laid-open Patent Publication No. 2005-30877
Patent Document 2: Japanese Laid-open Patent Publication No. 2007-78407
Patent Document 3: Japanese Laid-open Patent Publication No. 2005-283389
Patent Document 4: Japanese Laid-open Patent Publication No. 10-339765
Patent Document 5: Japanese Laid-open Patent Publication No. 2001-266596

When the semiconductor integrated circuit apparatus is a package or wafer, the semiconductor integrated circuit apparatus can be tested by connecting an external testing apparatus to the semiconductor integrated circuit apparatus. However, the external testing apparatus involves a problem that it is expensive, requires many man-hours, a testing cost tends to increase and it is not possible to test the semiconductor integrated circuit apparatus after shipment.

In contrast, the semiconductor integrated circuit apparatus including the built-in testing circuit and the power generation circuit that generates power using a carrier inputted from outside requires no external testing apparatus. However, power generated by the power generation circuit is small and testing includes many testing items. Testing all testing items may lead to an increase in power consumption and testing accuracy deteriorates due to power shortage.

SUMMARY

An integrated circuit is one that performs radio communication with an external apparatus and includes a processing circuit, a diagnostic circuit configured to perform a diagnosis of the processing circuit according to a plurality of diagnostic items and a charging circuit configured to store charge for causing the diagnostic circuit to operate, during a period of performing radio communication, in which the diagnostic circuit is configured to perform the diagnosis on a first subset of the plurality of diagnostic items by using the charge stored in the charging circuit during a first period of not performing radio communication.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 1 is a flowchart illustrating a diagnostic method of a diagnostic system according to a first embodiment.

FIG. 8 is a diagram illustrating operation of a logic circuit;

FIGS. 9A to 9C are diagrams illustrating processing by a charging circuit;

FIG. 10 is a diagram illustrating a configuration example of the charging circuit;

FIG. 11 is a diagram illustrating operation of the charging circuit in FIG. 10;

FIG. 15 is a diagram illustrating operation of a logic circuit in FIG. 14;

FIG. 16 is a diagram for describing a method for a self-diagnostic circuit to make a diagnosis on diagnostic items;

FIG. 17 is a diagram illustrating a time variation of a first supply voltage;

DESCRIPTION OF EMBODIMENTS (First Embodiment)

Figure 2:
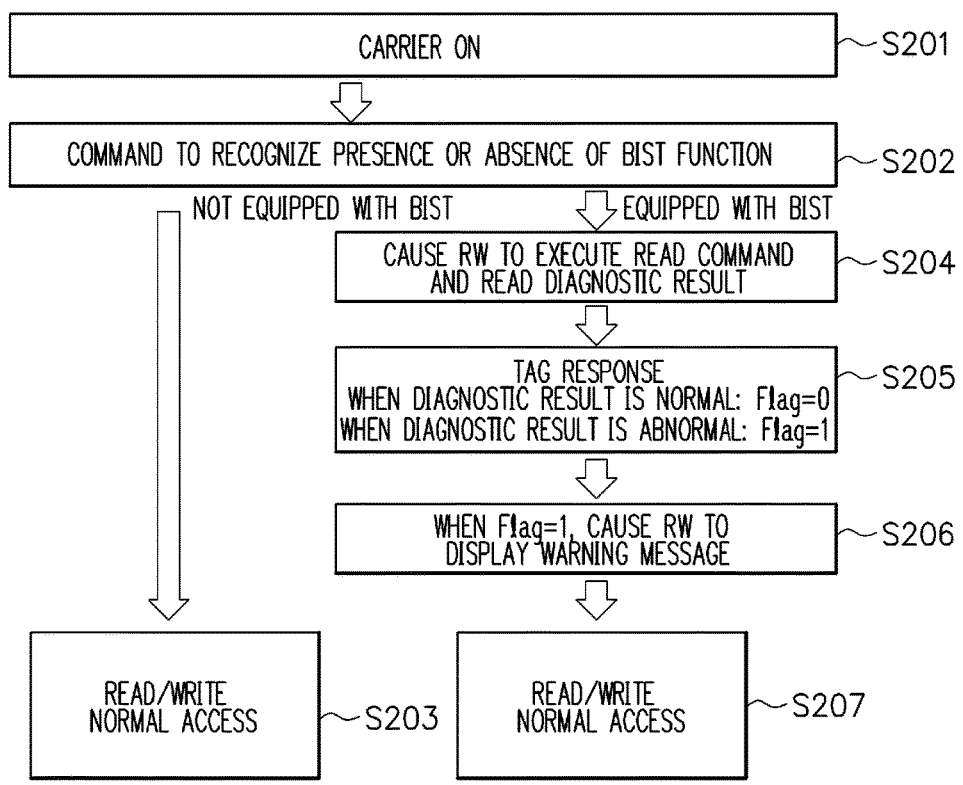
FIG. 2 is a flowchart illustrating details of steps S103 and S104 in FIG. 1.

FIG. 1 is a flowchart illustrating a diagnostic method of a diagnostic system according to a first embodiment. The diagnostic system includes a reader writer (RW) 110 and a radio tag 111. The reader writer 110 is an external apparatus. The radio tag 111 is an RFID (radio frequency identifier) radio tag. The reader writer 110 can perform radio communication with the radio tag 111 via an antenna. The radio tag 111 can also perform radio communication with the reader writer 110 via an antenna. The reader writer 110 can read or write data from/to the radio tag 111.

In step S101, the reader writer 110 transmits a carrier including a signal wave to the radio tag 111 for normal access. A radio communication period (carrier on) starts in this way. During the radio communication period of the reader writer 110 and the radio tag 111, the reader writer 110 continues to transmit carriers to the radio tag 111. The radio tag 111 rectifies the carrier received from the reader writer 110, generates a DC supply voltage and operates based on the supply voltage during the radio communication period. The reader writer 110 makes normal access such as data read or data write on the radio tag 111. The radio tag 111 stores charge of the above-described rectified supply voltage in a capacitor. When the normal access ends, the flow proceeds to step S102.

In step S102, the reader writer 110 ends transmission of the carrier to the radio tag 111. The radio communication period ends and a period (carrier off) during which radio communication is not performed starts in this way. The radio tag 111 diagnoses an inner processing circuit using the charge stored in the above-described capacitor as a supply voltage and writes the diagnostic result to an inner non-volatile memory. Since this diagnosis is made for a period of not performing radio communication, it is possible to prevent power consumption from increasing during the radio communication in step S101 and prevent deterioration of diagnostic accuracy due to power shortage. According to the present embodiment, since the diagnosis is made for a period of not performing radio communication, it is possible to reduce power consumption during radio communication and diagnose the processing circuit with high accuracy.

Next, in step S103, the reader writer 110 transmits a carrier including a signal wave to the radio tag 111 for normal access. The period of not performing radio communication ends and a radio communication period starts in this way. The radio tag 111 rectifies the carrier received from the reader writer 110, generates a DC supply voltage and operates based on the supply voltage for a radio communication period. After communication with the radio tag 111 is established, the reader writer 110 transmits a read command for reading a diagnostic result to the radio tag 111. Upon receiving the read command from the reader writer 110, the radio tag 111 reads the diagnostic result from the inner non-volatile memory.

Next, in step S104, the radio tag 111 transmits the above-described read diagnostic result to the reader writer 110. The reader writer 110 receives the diagnostic result from the radio tag 111 and displays, when the diagnostic result is abnormal (NG), an error code indicating the abnormality. Note that when the diagnostic result includes results of a plurality of diagnostic items, if even one of the plurality of diagnostic items is abnormal, the reader writer 110 displays an error code indicating the abnormality.

A warranty period of the radio tag 111 is approximately 10 years, which is long. Even when the radio tag 111 is diagnosed to be normal at the time of factory shipment, the radio tag 111 may deteriorate over time due to incidence of radiation, folding by an external force and the diagnostic result may become abnormal. By displaying an error code, the user can anticipate a failure of the radio tag 111 and replace the radio tag 111 before the failure actually occurs.

After that, the reader writer 110 makes normal access such as data read or data write to the radio tag 111. The radio tag 111 stores the charge of the above-described rectified supply voltage in the capacitor. When the normal access ends, the flow returns to step S102 and repeats the above-described processing.

FIG. 2 is a flowchart illustrating details of steps S103 and S104 in FIG. 1. In step S201, the reader writer 110 transmits a carrier including a signal wave to the radio tag 111 for normal access. A radio communication period starts in this way.

Next, in step S202, the reader writer 110 transmits to the radio tag 111, a command for recognizing whether or not the radio tag 111 has a self-diagnostic (BIST: built-in self test) function. Upon receiving the above-described command, the radio tag 111 transmits, when the radio tag 111 has the self-diagnostic circuit (BIST circuit) 303 (FIG. 3), information that the radio tag 111 has the self-diagnostic function to the reader writer 110. In contrast, when the radio tag 111 does not have the self-diagnostic circuit 303, the radio tag 111 transmits information that the radio tag 111 does not have the self-diagnostic function to the reader writer 110 or does not respond to the reader writer 110.

Upon receiving the information that the radio tag 111 has the self-diagnostic function, the reader writer 110 proceeds to step S204. In contrast, when the reader writer 110 receives the information that the radio tag 111 does not have the self-diagnostic function or when there is no response from the radio tag 111 within a predetermined period, the reader writer 110 proceeds to step S203.

In step S204, the reader writer 110 transmits a read command to the radio tag 111 to read a diagnostic result of the radio tag 111. Upon receiving the read command from the reader writer 110, the radio tag 111 reads the diagnostic result from the inner non-volatile memory.

Next, in step S205, the radio tag 111 transmits an error flag of "0" to the reader writer 110 when the diagnostic result is normal and transmits an error flag of "1" to the reader writer 110 when the diagnostic result is abnormal.

Next, in step S206, the reader writer 110 receives the above-described error flag and when the error flag is "1," the reader writer 110 displays a warning message. For example, the reader writer 110 displays a warning message "Deterioration discovered with item number 1, replace it as early as possible."

Next, in step S207, the reader writer 110 makes normal access such as data read or data write to the radio tag 111.

When the radio tag 111 has no self-diagnostic function, the reader writer 110 does not execute the processes in steps S204 to S206 but makes normal access such as data read or data write to the radio tag 111 in step S203.

Figure 3:
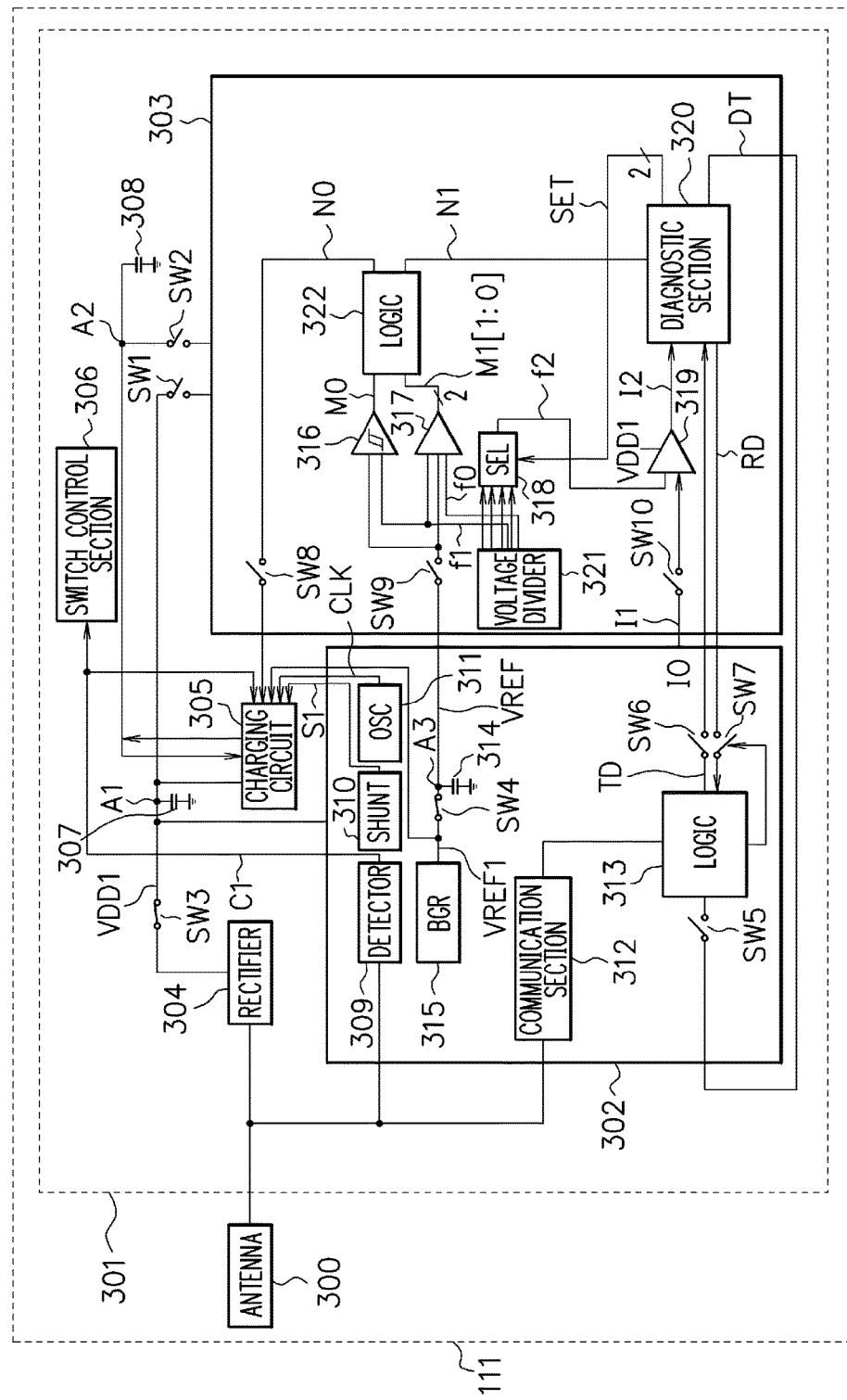
FIG. 3 is a diagram illustrating a configuration example of a radio tag.

FIG. 3 is a diagram illustrating a configuration example of the radio tag 111. The radio tag 111 includes an antenna 300 and an integrated circuit 301. The integrated circuit 301 can perform radio communication with the reader writer 110 via the antenna 300. The integrated circuit 301 includes a processing circuit (main circuit) 302, a self-diagnostic circuit (BIST circuit) 303, a rectifier 304, a charging circuit 305, a switch control section 306, capacitors 307 and 308, and switches SW1 to SW3. The processing circuit 302 includes a detector 309, a shunt circuit 310, an oscillator (OSC) 311, a communication section 312, a logic circuit 313, a capacitor 314, a BGR (band gap reference) circuit 315, and switches SW4 to SW7. The self-diagnostic circuit 303 includes comparators 316 and 317, a selector 318, a comparator 319, a diagnostic section 320, a voltage divider 321, a logic circuit 322, and switches SW8 to SW10.

The detector 309 detects the level of a radio signal received from the reader writer 110 via the antenna 300 and outputs a control signal C1 to the switch control section 306 and the charging circuit 305. For the radio communication periods in steps S101, S103 and S104 in FIG. 1, the reader writer 110 transmits a carrier to the radio tag 111, the detector 309 detects that the level of the received signal is high and outputs a high-level control signal C1. In contrast, for the period of not performing radio communication in step S102 in FIG. 1, the reader writer 110 does not transmit any carrier to the radio tag 111, the detector 309 detects that the level of the received signal is low and outputs a low-level control signal C1. That is, the detector 309 detects whether or not the radio tag 111 is performing radio communication with the reader writer 110 and outputs a control signal C1 indicating the detection result. The switch control section 306 controls the switches SW1 to SW6 and SW8 to SW10 based on the control signal C1.

The rectifier 304 is a charging circuit that rectifies an AC signal (carrier) wirelessly received from the reader writer 110 via the antenna 300 to a DC signal and stores charge in the capacitor 307 via the switch SW3. The capacitor 307 is connected between a node A1 and a ground potential node. When the capacitor 307 is charged, the voltage at the node A1 becomes a first supply voltage VDD1. That is, the rectifier 304 charges the capacitor 307 to generate the first supply voltage VDD1. The first supply voltage VDD1 is, for example, 1.8 V. A power supply terminal of the processing circuit 302 is connected to the node A1 and when the node A1 is charged to the first supply voltage VDD1, the processing circuit 302 is enabled to operate. The first supply voltage VDD1 is an operating voltage of the processing circuit 302.

The oscillator 311 generates a clock signal CLK and outputs the clock signal CLK to the charging circuit 305. The shunt circuit 310 outputs a high-level control signal S1 to the charging circuit 305 when enabling the shunt function and outputs a low-level control signal S1 to the charging circuit 305 when disabling the shunt function.

When the control signal S1 is high level, if the voltage VDD1 at the node A1 is higher than 1.8 V, the charging circuit 305 causes the charge of the capacitor 307 to be discharged to keep the voltage VDD1 at the node A1 to 1.8 V. On the other hand, when the control signal C1 is high level, the charging circuit 305 outputs a voltage obtained by boosting the voltage VDD1 at the node A1 to the capacitor 308. The capacitor 308 is connected between a node A2 and the ground potential node. This causes the voltage at the node A2 to become a second supply voltage VDD2. That is, the charging circuit 305 charges the capacitor 308 to generate the second supply voltage VDD2. The second supply voltage VDD2 is, for example, 3.3 V which is higher than the first supply voltage VDD1. When the control signal C1 is low level and the first supply voltage VDD1 is lower than 1.8 V, the charging circuit 305 outputs a voltage obtained by stepping down the voltage at the node A2 to the capacitor 307 according to a control signal N0. Thus, the voltage VDD1 at the node A1 is kept to 1.8 V.

The communication section 312 transmits and receives signals to/from the reader writer 110 via the antenna 300. For example, the communication section 312 is a circuit. The logic circuit 313 controls transmission and reception of the communication section 312. Furthermore, the logic circuit 313 performs processing based on a signal received by the communication section 312 and outputs the processed data or command to the communication section 312. The communication section 312 wirelessly transmits the data or command to the reader writer 110 via the antenna 300. The logic circuit 313 includes a memory.

The BGR circuit 315 generates a constant reference voltage VREF1 of 1.0 V, outputs the reference voltage VREF1 to the charging circuit 305 and outputs the reference voltage VREF1 to the node A3 via the switch SW4. The capacitor 314 is connected between a node A3 and the ground potential node. The voltage at the node A3 is a reference voltage VREF. When the switch SW4 is switched on and charge is stored in the capacitor 314, the reference voltage VREF becomes a constant voltage of 1.0 V.

FIG. 3 is a diagram illustrating states of the switches SW1 to SW10 in step S101 in FIG. 1. In this case, the detector 309 detects that the level of a received signal is high and outputs a high-level control signal C1. The switch control section 306 controls the switches SW1 to SW6 and SW8 to SW10 in accordance with the control signal C1. The logic circuit 313 controls the switch SW7. The switches SW3 and SW4 are in an on-state and the switches SW1, SW2, SW5 to SW10 are in an off-state. Since the switch SW3 is in an on-state, the rectifier 304 outputs the rectified signal to the node A1. Thus, charge is stored in the capacitor 307 and the voltage VDD1 at the node A1 becomes 1.8 V. Moreover, since the switch SW4 is in an on-state, the BGR circuit 315 outputs the reference voltage VREF1 to the node A3. In this way, charge is stored in the capacitor 314 and the voltage VREF at the node A3 becomes 1.0 V.

Figure 4:
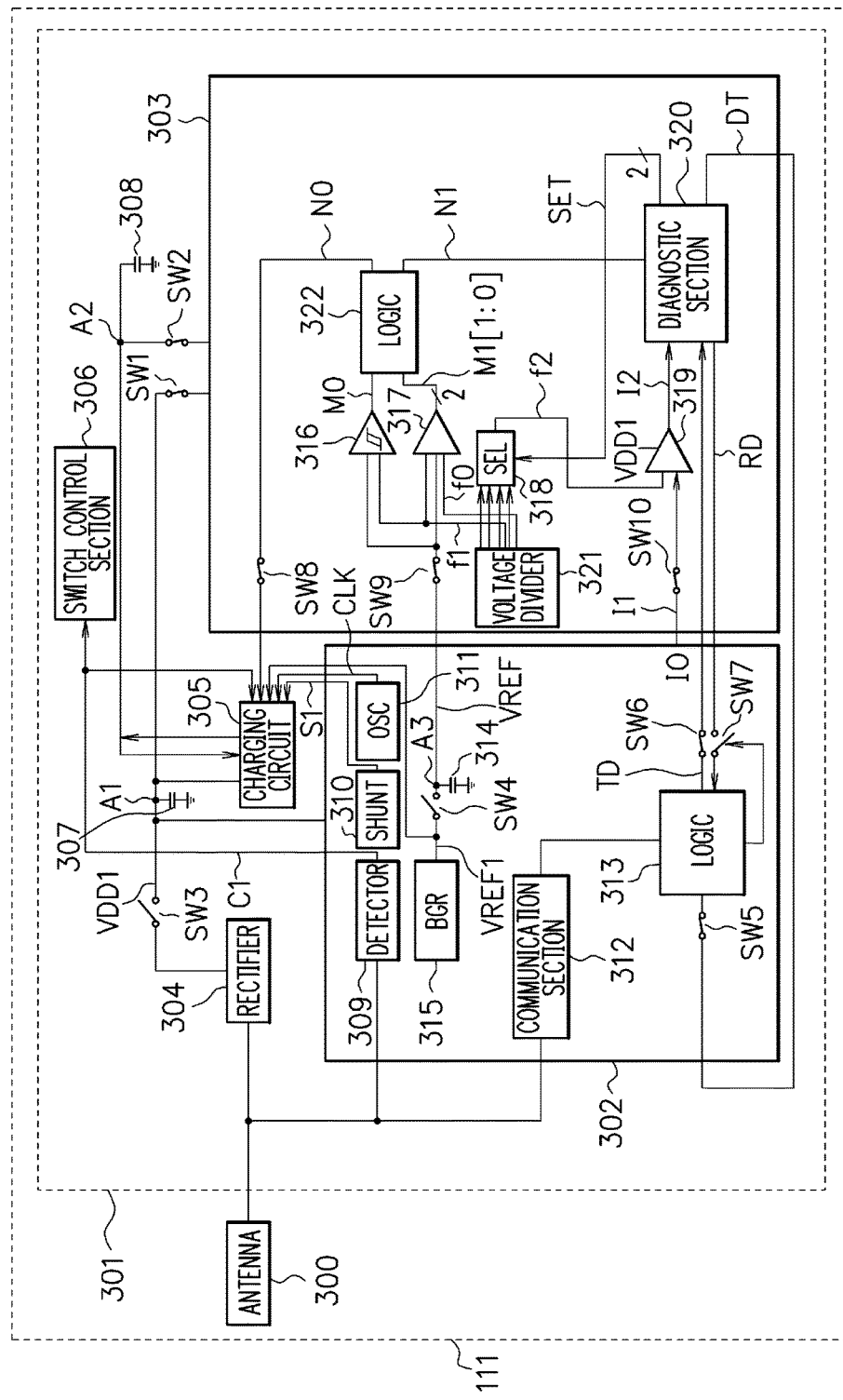
FIG. 4 is a diagram illustrating states of switches in step S102 in FIG. 1.

FIG. 4 is a diagram illustrating states of the switches SW1 to SW10 in step S102 in FIG. 1. In this case, the detector 309 detects that the level of a received signal is low and outputs a low-level control signal C1. The switch control section 306 controls the switches SW1 to SW6 and SW8 to SW10 in accordance with the control signal C1. The logic circuit 313 controls the switch SW7. The switches SW1, SW2, SW5, SW6, SW8 to SW10 are in on-states and the switches SW3, SW4 and SW7 are in off-states.

Since the switch SW1 is in an on-state, the first supply voltage VDD1 (1.8 V) is supplied to a first power supply terminal of the self-diagnostic circuit 303. Furthermore, since the switch SW2 is in an on-state, the second supply voltage VDD2 (3.3 V) is supplied to a second power supply terminal of the self-diagnostic circuit 303. The self-diagnostic circuit 303 receives supplies of the first supply voltage VDD1 and the second supply voltage VDD2 and is enabled to operate.

Furthermore, since the switch SW9 is in an on-state, the reference voltage VREF is supplied to the comparators 316 and 317. The voltage divider 321 divides the first supply voltage VDD1 (1.8 V) and generates a voltage f0 (0.99 V) and a voltage f1 (1.01 V).

As shown in FIG. 8, the comparator 316 outputs a signal M0 of "1" when the voltage f1 is higher than the reference voltage VREF (1.0 V) and outputs a signal M0 of "0" when the voltage f1 is lower than the reference voltage VREF (1.0 V). Charge is stored in the capacitor 307 initially, the first supply voltage VDD1 is 1.8 V and the voltage f1 is 1.01 V, and therefore the signal M0 becomes "1." As shown in FIG. 8, the logic circuit 322 outputs a signal N0 of "1" to the charging circuit 305 when the signal M0 is "1." When the signal N0 is "1," the first supply voltage VDD1 is approximately 1.8 V, and therefore the charging circuit 305 does not charge the capacitor 307.

Here, since the switch SW3 is in an off-state and the rectifier 304 does not charge the capacitor 307, the first supply voltage VDD1 gradually decreases from 1.8 V. Accordingly, the voltage f1 also gradually decreases from 1.01 V. When the voltage f1 falls below the reference voltage VREF (1.0 V), the signal M0 becomes "0." As shown in FIG. 8, when the signal M0 is "0," the logic circuit 322 outputs a signal N0 of "0" to the charging circuit 305. When the signal N0 is "0," the first supply voltage VDD1 is lower than 1.8 V, and therefore the charging circuit 305 starts charging the capacitor 307 based on the second supply voltage VDD2. This causes the first supply voltage VDD1 to increase up to 1.8 V and causes the voltage f1 to increase up to 1.01 V.

Then, the output signal M0 of the comparator 316 becomes "1" and the output signal N0 of the logic circuit 322 becomes "1" and the charging circuit 305 ends charging of the capacitor 307. After that, the voltage f1 gradually decreases from 1.01 V and if the voltage f1 falls below the reference voltage VREF (1.0 V), the charging circuit 305 starts charging the capacitor 307 as described above. As described above, the charging circuit 305 repeatedly starts and ends charging the capacitor 307, and thereby causes the first supply voltage VDD1 to be kept to 1.8 V.

Next, the comparator 317 will be described. The comparator 317 outputs a 2-bit signal M1 [1:0] of "00" when the voltage f1 is lower than the reference voltage VREF as shown in FIG. 8. On the other hand, the comparator 317 outputs a 2-bit signal M1 [1:0] of "01" when the voltage f0 is lower than the reference voltage VREF and the voltage f1 is higher than the reference voltage VREF. Furthermore, the comparator 317 outputs a 2-bit signal M1 [1:0] of "10" when the voltage f0 is higher than the reference voltage VREF.

When the distance between the radio tag 111 and the reader writer 110 is an appropriate value, the first supply voltage VDD1 becomes 1.8 V, and therefore the voltage f0 becomes 0.99 V, the voltage f1 becomes 1.01 V and the signal M1 [1:0] becomes "01." The logic circuit 322 outputs a signal N1 of "1" to an enable terminal of the diagnostic section 320 when the signal M1 [1:0] is "01" as shown in FIG. 8. The diagnostic section 320 is enabled to operate when the signal N1 is "1" since the first supply voltage VDD1 is approximately 1.8 V.

In contrast, when the distance between the radio tag 111 and the reader writer 110 is too large, if the first supply voltage VDD1 falls below 1.8 V and the voltage f1 falls below the reference voltage VREF (1.0 V), the signal M1 [1:0] becomes "00." The logic circuit 322 outputs a signal N1 of "0" to the enable terminal of the diagnostic section 320 when the signal M1 [1:0] is "00" as shown in FIG. 8. The diagnostic section 320 is disabled to operate when the signal N1 is "0" since the first supply voltage VDD1 is lower than an operable voltage range.

When the distance between the radio tag 111 and the reader writer 110 is too small, if the first supply voltage VDD1 is higher than 1.8 V and the voltage f0 is higher than the reference voltage VREF (1.0 V), the signal M1 [1:0] becomes "10." As shown in FIG. 8, when the signal M1 [1:0] is "10," the logic circuit 322 outputs a signal N1 of "0" to the enable terminal of the diagnostic section 320. When the signal N1 is "0," since the first supply voltage VDD1 is higher than an operable voltage range, the diagnostic section 320 is disabled to operate.

In order to diagnose the processing circuit 302, the diagnostic section 320 outputs a 2-bit signal SET to the selector 318 in accordance with diagnostic items and outputs a diagnostic signal DT to the logic circuit 313. The diagnostic signal DT includes data and a control signal. The logic circuit 313 performs processing based on the diagnostic signal DT and outputs data TD indicating the processing result to the diagnostic section 320. The processing circuit 302 outputs an analog signal I1 from an input/output terminal 10. The analog signal I1 is a voltage or the like of an inner node of the processing circuit 302. For example, the analog signal I1 is a voltage of an inner node of the shunt circuit 310.

The voltage divider 321 divides the first supply voltage VDD1 and outputs a plurality of voltages to the selector 318. The selector 318 selects one voltage f2 from among the plurality of voltages in accordance with a signal SET and outputs the voltage f2 to the comparator 319. The comparator 319 outputs a signal I2 of "1" to the diagnostic section 320 when the analog signal I1 is higher than the voltage f2, and outputs a signal I2 of "0" to the diagnostic section 320 when the analog signal I1 is lower than the voltage f2. The diagnostic section 320 writes a normal diagnostic result to an inner non-volatile memory when the data TD is the same as an expected value and writes an abnormal diagnostic result to the inner non-volatile memory when the data TD is different from the expected value. Furthermore, the diagnostic section 320 writes a normal diagnostic result to the inner non-volatile memory when the output signal I2 of the comparator 319 is the same as the expected value and writes an abnormal diagnostic result to the inner non-volatile memory when the output signal I2 of the comparator 319 is different from the expected value.

Figure 5:
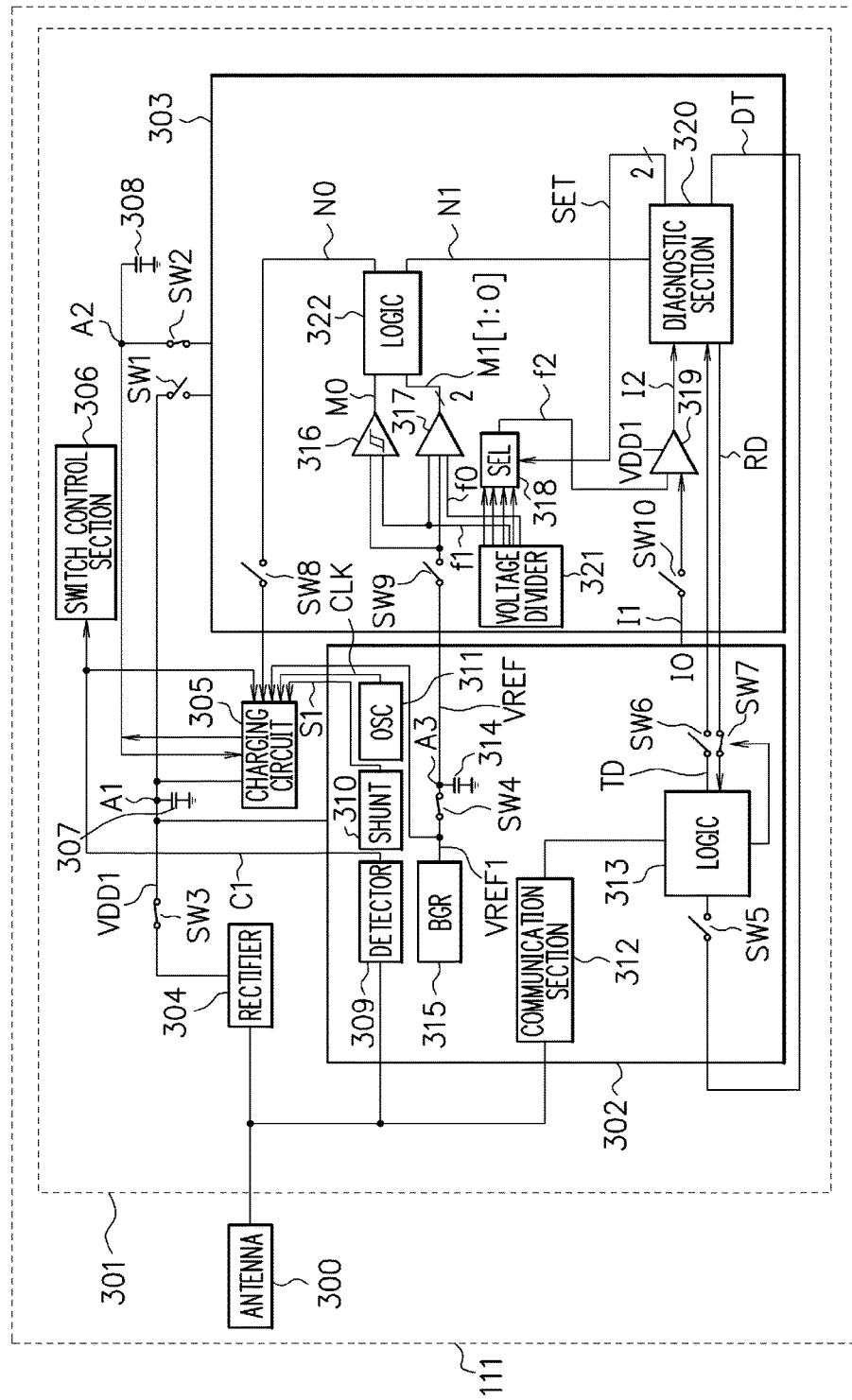
FIG. 5 is a diagram illustrating states of switches in steps S103 and S104 in FIG. 1.

FIG. 5 is a diagram illustrating states of the switches SW1 to SW10 in steps S103 and S104 in FIG. 1. In this case, the detector 309 detects that the level of a received signal is high and outputs a high-level control signal C1. The switch control section 306 controls the switches SW1 to SW6 and SW8 to SW10 in accordance with the control signal C1. The logic circuit 313 controls the switch SW7. The switches SW2, SW3, SW4 and SW7 are in on-states and the switches SW1, SW5, SW6, SW8 to SW10 are in off-states.

The communication section 312 receives a read command for reading the diagnostic result from the reader writer 110 via the antenna 300. Then, the logic circuit 313 sets the switch SW7 to an on-state. Since the switches SW2 and SW7 are in on-states, the diagnostic section 320 reads an error flag indicating the diagnostic result from the inner non-volatile memory and outputs an error flag RD to the logic circuit 313. The logic circuit 313 outputs the error flag RD to the communication section 312. The communication section 312 transmits the error flag RD to the reader writer 110 via the antenna 300. Note that the operation based on the fact that the switch SW3 and SW4 are in on-states is the same as that in the case of FIG. 3.

Figure 6:
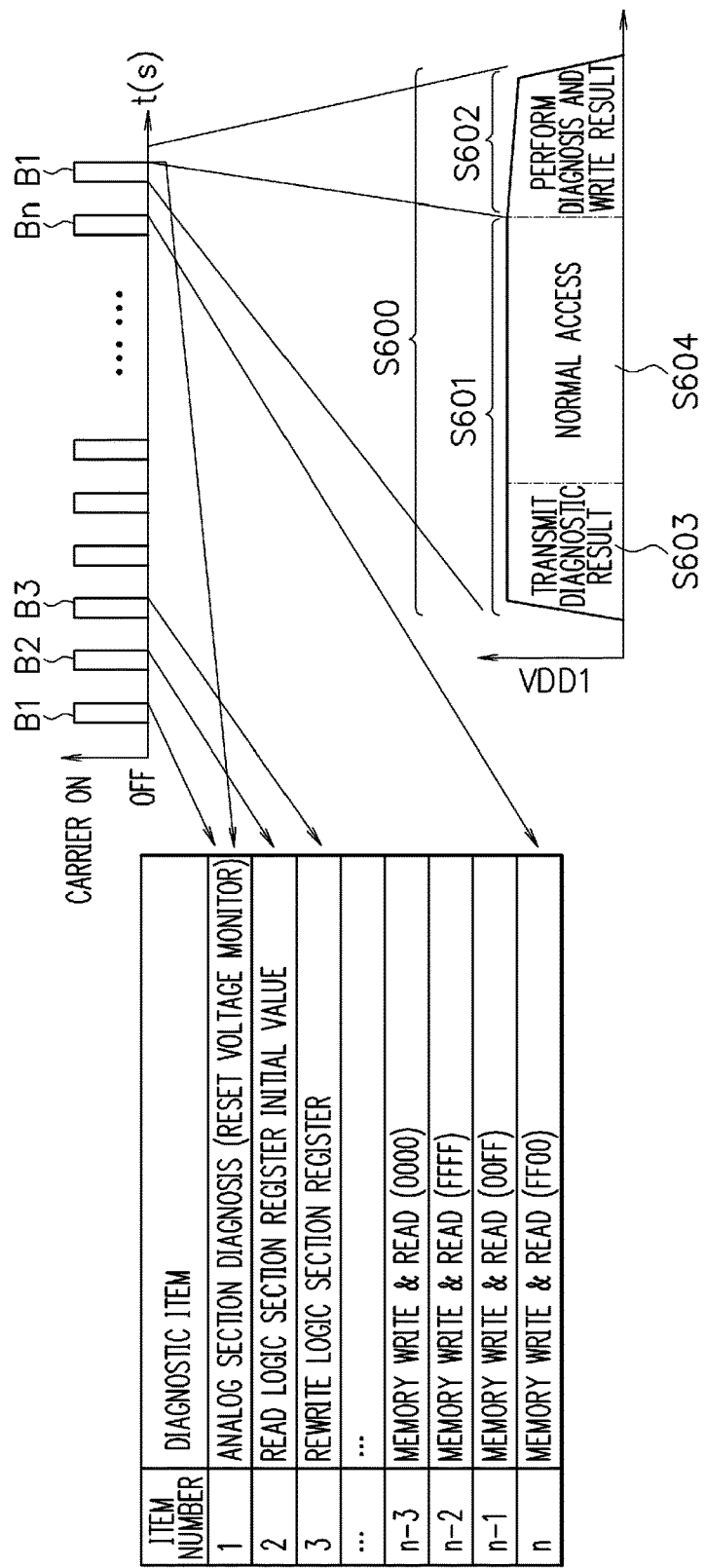
FIG. 6 is a diagram for describing a method for a self-diagnostic circuit to make a diagnosis on n diagnostic items.

FIG. 6 is a diagram for describing a method for the self-diagnostic circuit 303 to make a diagnosis on n diagnostic items. Radio communication periods B1 to Bn represent n radio communication periods, high level represents a radio communication period (carrier on) and low level represents a period during which radio communication is not performed (carrier off).

When the reader writer 110 starts radio transmission to the radio tag 111, a first radio communication period B1 starts. For the first radio communication period B1, the radio tag 111 performs the processing (including normal access) in FIG. 3. When the reader writer 110 ends radio transmission to the radio tag 111, the first radio communication period B1 ends.

For a period of not performing radio communication after the end of the first radio communication period B1, the radio tag 111 makes a diagnosis through a process S602 according to a diagnostic item of item number 1 based on the process in FIG. 4 and writes the diagnostic result to the non-volatile memory. The diagnostic item of item number 1 is, for example, an analog section diagnosis (reset voltage monitor).

After that, when the reader writer 110 starts radio transmission to the radio tag 111, a second radio communication period B2 starts. For the second radio communication period B2, the radio tag 111 performs a process S601 corresponding to the process in FIG. 5. The process S601 includes a process S603 and a process S604. In the process S603, when the radio tag 111 receives a read command for reading the diagnostic result from the reader writer 110, the radio tag 111 reads the diagnostic result of item number 1 in the non-volatile memory and transmits the diagnostic result to the reader writer 110. After that, in step S604, the reader writer 110 makes normal access to the radio tag 111. When the reader writer 110 ends radio transmission to the radio tag 111, the second radio communication period B2 ends.

For a period of not performing radio communication after the end of the second radio communication period B2, the radio tag 111 makes a diagnosis through the process S602 based on the process in FIG. 4 in accordance with a diagnostic item of item number 2 and writes the diagnostic result to the non-volatile memory. The diagnostic item of item number 2 is, for example, a logic section register initial value reading diagnosis. The above-described processes S601 and S602 become one-cycle process S600. Hereinafter, one-cycle process S600 is repeated.

After that, when the reader writer 110 starts radio transmission to the radio tag 111, a third radio communication period B3 starts. For the third radio communication period B3, the radio tag 111 performs the process S601 corresponding to the process in FIG. 5. The process S601 includes the process S603 and the process S604. In the process S603, when the radio tag 111 receives a read command for reading the diagnostic result from the reader writer 110, the radio tag 111 reads the diagnostic result of item number 2 in the non-volatile memory and transmits the diagnostic result to the reader writer 110. After that, in step S604, the reader writer 110 makes normal access to the radio tag 111. When the reader writer 110 ends radio transmission to the radio tag 111, the third radio communication period B3 ends.

For a period of not performing radio communication after the end of the third radio communication period B3, the radio tag 111 makes a diagnosis according to a diagnostic item of item number 3 through the process S602 based on the process in FIG. 4 and writes the diagnostic result to the non-volatile memory. The diagnostic item of item number 3 is, for example, a logic section register rewrite diagnosis.

Similarly, for an n-th radio communication period Bn, the radio tag 111 performs the process S601 corresponding to the process in FIG. 5. The process S601 includes the process S603 and the process S604. In the process S603, when the radio tag 111 receives a read command for reading the diagnostic result from the reader writer 110, the radio tag 111 reads the diagnostic result of item number n-1 in the non-volatile memory and transmits the diagnostic result to the reader writer 110. After that, in step S604, the reader writer 110 makes normal access to the radio tag 111.

For a period of not performing radio communication after the end of the n-th radio communication period Bn, the radio tag 111 makes a diagnosis according to a diagnostic item of item number n through the process S602 based on the process in FIG. 4 and writes the diagnostic result to the non-volatile memory. The diagnostic item of item number n is, for example, a write or read diagnosis of data FF00 to/from the memory.

After that, when the reader writer 110 starts radio transmission to the radio tag 111, the first radio communication period B1 starts again. For the first radio communication period B1, the radio tag 111 performs the process S601 corresponding to the process in FIG. 5. The process S601 includes the process S603 and the process S604. In the process S603, when the radio tag 111 receives a read command for reading the diagnostic result from the reader writer 110, the radio tag 111 reads the diagnostic result of item number n in the non-volatile memory and transmits the diagnostic result to the reader writer 110. After that, in step S604, the reader writer 110 makes normal access to the radio tag 111. When the reader writer 110 ends radio transmission to the radio tag 111, the first radio communication period B1 ends. For the following period of not performing radio communication, the radio tag 111 makes a diagnosis according to a diagnostic item of item number 1.

As described above, the processes for the above-described n radio communication periods B1 to Bn are repeatedly performed. Assuming the carrier on process S601 and the carrier off process S602 as one-cycle process S600, one-cycle process S600 is repeatedly performed. Although an example has been described where a diagnosis is made according to only one diagnostic item in one-cycle, a diagnosis may be made according to a plurality of diagnostic items.

Figure 7:
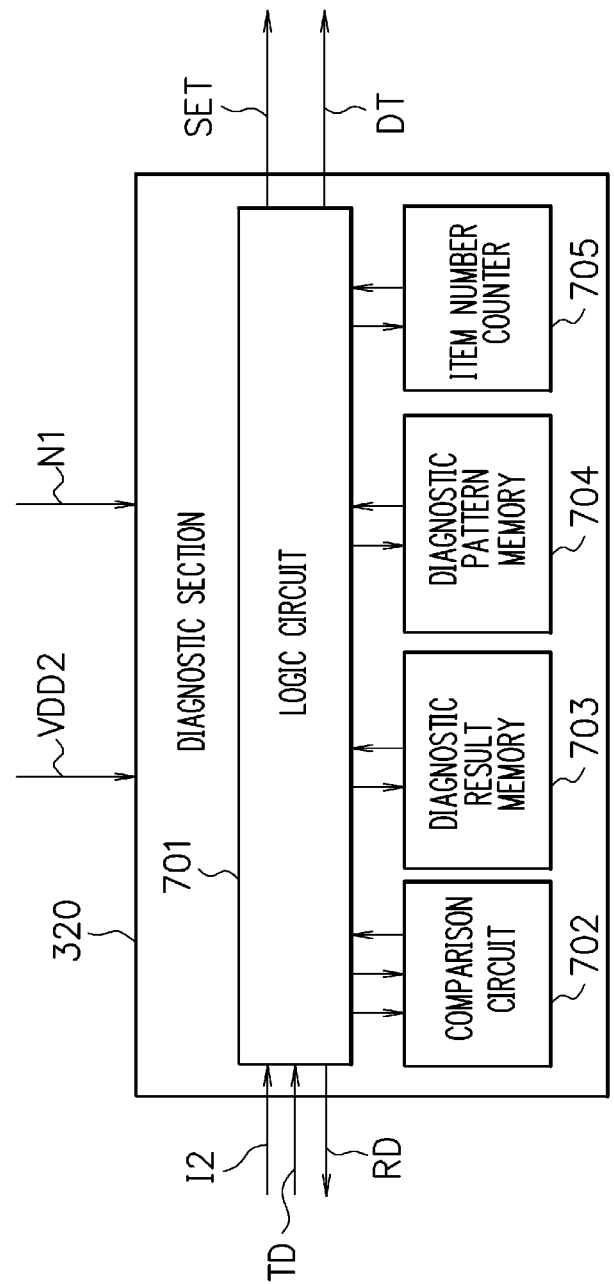
FIG. 7 is a diagram illustrating a configuration example of a diagnostic section.

FIG. 7 is a diagram illustrating a configuration example of the diagnostic section 320. The diagnostic section 320 includes a logic circuit 701, a comparison circuit 702, a diagnostic result memory 703, a diagnostic pattern memory 704 and an item number counter 705. The diagnostic result memory 703 and the diagnostic pattern memory 704 are non-volatile memories. The diagnostic pattern memory 704 stores setting information indicating diagnostic items. The diagnostic result memory 703 stores diagnostic results.

First, processing by the diagnostic section 320 in the state in FIG. 4 will be described. The diagnostic section 320 receives a supply of the second supply voltage VDD2, is operation-disabled when a signal N1 is "0" and enabled to operate when the signal N1 is "1." While receiving a supply of the second supply voltage VDD2, the diagnostic section 320 is activated when the signal N1 turns from "0" to "1." The item number counter 705 outputs item number 1 to the logic circuit 701. The logic circuit 701 reads a diagnostic pattern (diagnostic signal) DT and a signal SET corresponding to item number 1 from the diagnostic pattern memory 704, outputs the diagnostic pattern DT to the logic circuit 313 and outputs the signal SET to the selector 318. The logic circuit 313 performs processing for the diagnosis based on the diagnostic pattern DT and outputs the data TD of the processing result to the diagnostic section 320. The selector 318 outputs the voltage f2 in accordance with the signal SEL. The comparator 319 outputs a signal I2 to the diagnostic section 320 in accordance with the comparison result of the analog signal I1 and the voltage f2 from the input/output terminal IO. The logic circuit 701 outputs the signal I2 or data TD to the comparison circuit 702 in accordance with item number 1. Furthermore, the logic circuit 701 reads an expected value corresponding to item number 1 from the diagnostic pattern memory 704 and outputs the expected value to the comparison circuit 702. When the signal I2 or data DT is the same as the expected value, the comparison circuit 702 outputs an error flag of "0" indicating a normal diagnostic result to the logic circuit 701. In contrast, when the signal I2 or data DT is different from the expected value, the comparison circuit 702 outputs an error flag of "1" indicating an abnormal diagnostic result to the logic circuit 701. The logic circuit 701 writes the error flag to the diagnostic result memory 703.

Next, the processing by the diagnostic section 320 in the state in FIG. 5 will be described. The radio tag 111 receives a read command for reading a diagnostic result from the reader writer 110. The logic circuit 701 then reads an error flag of item number 1 from the diagnostic result memory 703 and outputs a diagnostic result RD including item number 1 and an error flag to the logic circuit 313. The communication section 312 transmits the diagnostic result RD to the reader writer 110 via the antenna 300. The reader writer 110 displays the item number and error information based on the diagnostic result RD.

The above-described processing is one-cycle processing of item number 1. After that, the item number counter 705 increments the item number and outputs item number 2 to the logic circuit 701. The diagnostic section 320 performs processing on item number 2 as in the case of the above-described processing. In this way, processing on item numbers 1 to n is performed, the flow then returns to item number 1 and processing on item numbers 1 to n is repeated.

FIG. 9A is a diagram illustrating processing by the charging circuit 305 at the start of a radio communication period. Since the period corresponds to a radio communication period, the detector 309 outputs a high level (H) control signal C1 to the charging circuit 305. As shown in FIG. 3 and FIG. 5, the switch SW8 is off and the terminal of the signal N0 of the charging circuit 305 is pulled down to a low level (L). The shunt circuit 310 outputs a high-level control signal S1 indicating that the shunt function is enabled to the charging circuit 305. In that case, the charging circuit 305 charges the capacitor 308 based on the first supply voltage VDD1 and generates the second supply voltage VDD2.

FIG. 9B is a diagram illustrating first processing by the charging circuit 305 for a period of not performing radio communication. Since this period is a period of not performing radio communication, the detector 309 outputs a low-level control signal C1 to the charging circuit 305. When the voltage f1 is lower than the reference voltage VREF as shown in FIG. 8, the logic circuit 322 outputs a low-level signal N0 to the charging circuit 305. The shunt circuit 310 outputs a low-level control signal S1 indicating that the shunt function is disabled to the charging circuit 305. In that case, the charging circuit 305 charges the capacitor 307 based on the second supply voltage VDD2 and generates the first supply voltage VDD1.

FIG. 9C is a diagram illustrating second processing by the charging circuit 305 for a period of not performing radio communication. Since this period is a period of not performing radio communication, the detector 309 outputs a low-level control signal C1 to the charging circuit 305. When the voltage f1 is higher than the reference voltage VREF as shown in FIG. 8, the logic circuit 322 outputs a high-level signal N0 to the charging circuit 305. The shunt circuit 310 outputs a low-level control signal S1 indicating that the shunt function is disabled to the charging circuit 305. In that case, the charging circuit 305 does not charge the capacitors 307 and 308.

FIG. 10 is a diagram illustrating a configuration example of the charging circuit 305. The charging circuit 305 includes a logic circuit 1001, a step-down circuit 1002, a charge pump 1003 and switches SW11 to SW14. The step-down circuit 1002 is a LDO (low drop out) regulator, includes an operational amplifier 1004, a p-channel field-effect transistor 1005 and resistors 1006 and 1007, and outputs a voltage obtained by stepping down the voltage at a node A7 to a node A4. The charge pump 1003 includes an inverter 1008, a capacitor 1009, diodes 1010 and 1011 and a capacitor 1012, and outputs a voltage obtained by boosting the voltage at a node A5 to a node A8.

FIG. 11 is a diagram illustrating operation of the charging circuit 305 in FIG. 10. When control signals C1, N0 and S1 are at low levels (the case in FIG. 9B), the logic circuit 1001 outputs a high-level signal X and a low-level signal Y. Then, the switches SW11 and SW12 are switched on, the switch SW13 connects the node A3 to the node A4 on the left and the switch SW14 connects the node A6 to the node A7 on the left. Then, the step-down circuit 1002 operates and the charge pump 1003 stops operating. The step-down circuit 1002 steps down the second supply voltage VDD2 at the node A2 and outputs the stepped down voltage to the node A1 as the first supply voltage VDD1.

When the control signals C1 and S1 are at high levels and the control signal N0 is at low level (the case in FIG. 9A), the logic circuit 1001 outputs high-level signals X and Y. Then, the switches SW11 and SW12 are switched on, the switch SW13 connects the node A3 to the node A5 on the right and the switch SW14 connects the node A6 to the node A8 on the left. Then, the step-down circuit 1002 stops operating and the charge pump 1003 operates. The charge pump 1003 boosts the first supply voltage VDD1 at the node A1 and outputs the boosted voltage to the node A2 as the second supply voltage VDD2.

When the combination of the control signals C1, N0 and S1 is other than that described above, the switches SW11 and SW12 are switched off and the step-down circuit 1002 and the charge pump 1003 stop operating. That is, the first supply voltage VDD1 and the second supply voltage VDD2 are not outputted.

Figures 12A, 12B:
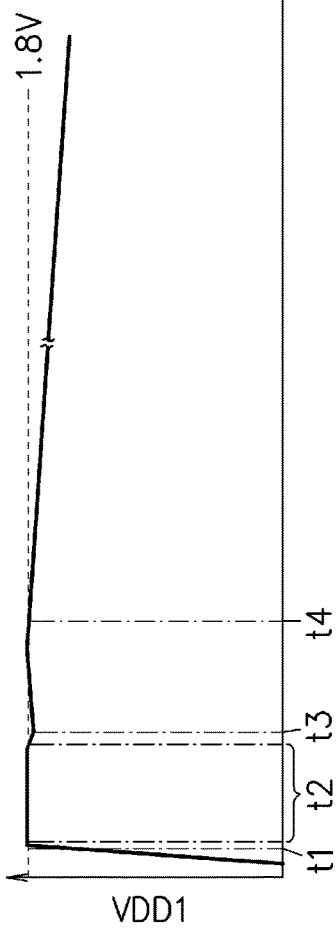
FIG. 12A is a diagram illustrating a time variation of a first supply voltage and FIG. 12B is a diagram illustrating operation of the radio tag.

FIG. 12A is a diagram illustrating a time variation of the first supply voltage VDD1 at the node A1 and FIG. 12B is a diagram illustrating operation of the radio tag 111. When the radio communication period starts, the first supply voltage VDD1 increases from 0 V to 1.8 V.

First, the radio communication period (carrier on) will be described. At time t1, since the first supply voltage VDD1 is lower than 1.8 V, the shunt circuit 310 outputs a low-level control signal S1 indicating shunt off. The rectifier 304 is in an operation-on-state, rectifies an AC signal and outputs the rectified signal to the node A1. The capacitor 307 stores charge outputted from the rectifier 304 and the first supply voltage VDD1 increases to 1.8 V. The capacitor 308 is not charged.

Next, during a period t2, the first supply voltage VDD1 becomes 1.8 V and the shunt circuit 310 outputs a high-level control signal S1 indicating shunt on. When the first supply voltage VDD1 exceeds 1.8 V, the charge of the capacitor 307 is discharged under the control of the shunt circuit 310, and the first supply voltage VDD1 is kept to 1.8 V. The rectifier 304 is in an operation-on-state, rectifies an AC signal and outputs the rectified signal to the node A1. The capacitor 307 stores the charge outputted from the rectifier 304 and is charged to the first supply voltage VDD1. The charge pump 1003 boosts the first supply voltage VDD1 at the node A1 and outputs the boosted voltage to the node A2 as the second supply voltage VDD2. The capacitor 308 is charged and the second supply voltage VDD2 becomes 3.3 V.

Next, the period of not performing radio communication (carrier off) will be described. At time t3, the first supply voltage VDD1 is lower than 1.8 V and the shunt circuit 310 outputs a low-level control signal S1 indicating shunt off. The rectifier 304 is in an operation-off-state. The step-down circuit 1002 steps down the second supply voltage VDD2 at the node A2 and outputs the stepped-down voltage to the node A1 as the first supply voltage VDD1. The capacitor 307 is charged in this way and the first supply voltage VDD1 increases to 1.8 V.

Next, for a period t4, the first supply voltage VDD1 becomes 1.8 V and the shunt circuit 310 outputs a low-level control signal S1 indicating shunt off. The rectifier 304 is in an operation-off-state, the step-down circuit 1002 and the charge pump 1003 are in an operation-stopped state and the capacitors 307 and 308 are not charged.

(Second Embodiment)

Figure 13:
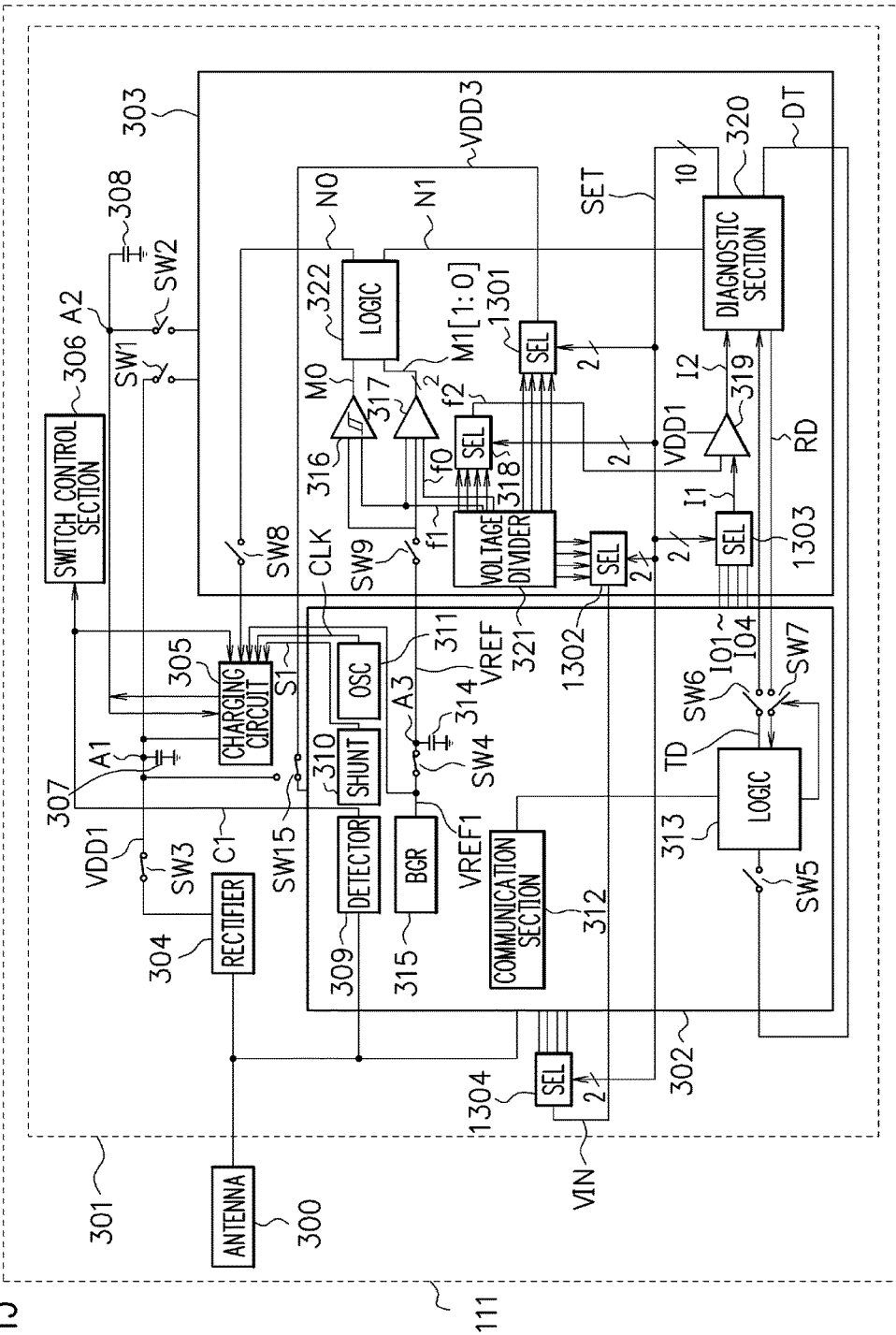
FIG. 13 is a diagram illustrating a configuration example of a radio tag according to a second embodiment.

FIG. 13 is a diagram illustrating a configuration example of the radio tag 111 according to a second embodiment. The radio tag 111 (FIG. 13) of the present embodiment corresponds to the radio tag 111 of the first embodiment (FIG. 3) to which selectors 1301 to 1304 are added. Hereinafter, differences of the present embodiment from the first embodiment will be described.

The diagnostic section 320 outputs a 10-bit signal SET. The 10-bit signal SET is supplied to five selectors 318 and 1301 to 1304, two bits each. The voltage divider 321 outputs four voltages of 1.8 V, 1.6 V, 1.4 V and 1.2 V to the selectors 1301 and 1302.

The selector 1301 selects one of the four voltages in accordance with a 2-bit signal SET and outputs the selected one voltage VDD3 to a power supply terminal of the processing circuit 302 via a switch SW15. The switch SW15 connects the power supply terminal of the processing circuit 302 to an output terminal of the selector 1301 during a diagnosis and connects the power supply terminal of the processing circuit 302 to the node A1 during normal operation. One of the four voltages of 1.8 V, 1.6 V, 1.4 V and 1.2 V is supplied to the power supply terminal of the processing circuit 302. This makes it possible to change the supply voltage of the processing circuit 302.

The selector 1302 selects any one of the four voltages in accordance with a 2-bit signal SET and outputs the one selected voltage VIN to the selector 1304. The voltage VIN is one of the four voltages of 1.8 V, 1.6 V, 1.4 V and 1.2 V. The selector 1304 outputs the voltage VIN to one of the four input terminals of the processing circuit 302 in accordance with a 2-bit signal SEL. Thus, one of the four input terminals becomes high level and an operating (function) mode is selected. For example, it is possible to select an operating mode that always causes the shunt function to be switched off. It is also possible to change the high-level voltage value.

The processing circuit 302 includes four input/output terminals IO1 to IO4. The selector 1303 selects one of the four output signals of the four input/output terminals IO1 to IO4 in accordance with a 2-bit signal SET and outputs the selected output signal I1 to the comparator 319.

According to the present embodiment, the selector 1301 can change the supply voltage of the power supply terminal of the processing circuit 302 during a diagnosis. It is thereby possible to make a diagnosis at various supply voltages. The selector 1304 also allows an operating mode to be selected during a diagnosis. The selector 1302 allows a high-level voltage value to be changed for selecting an operating mode thereof. This makes it possible to make a diagnosis with various high-level voltage values. The selector 1303 selects one of the output signals of the four input/output terminals IO1 to IO4 in accordance with diagnostic items, and can thereby make a diagnosis in order about the output signals of the input/output terminals IO1 to IO4. In the present embodiment, it is possible to create an operation environment that is not available during normal operation and make a diagnosis and failure investigation in a failure mode or a critical state.

(Third Embodiment)

Figure 14:
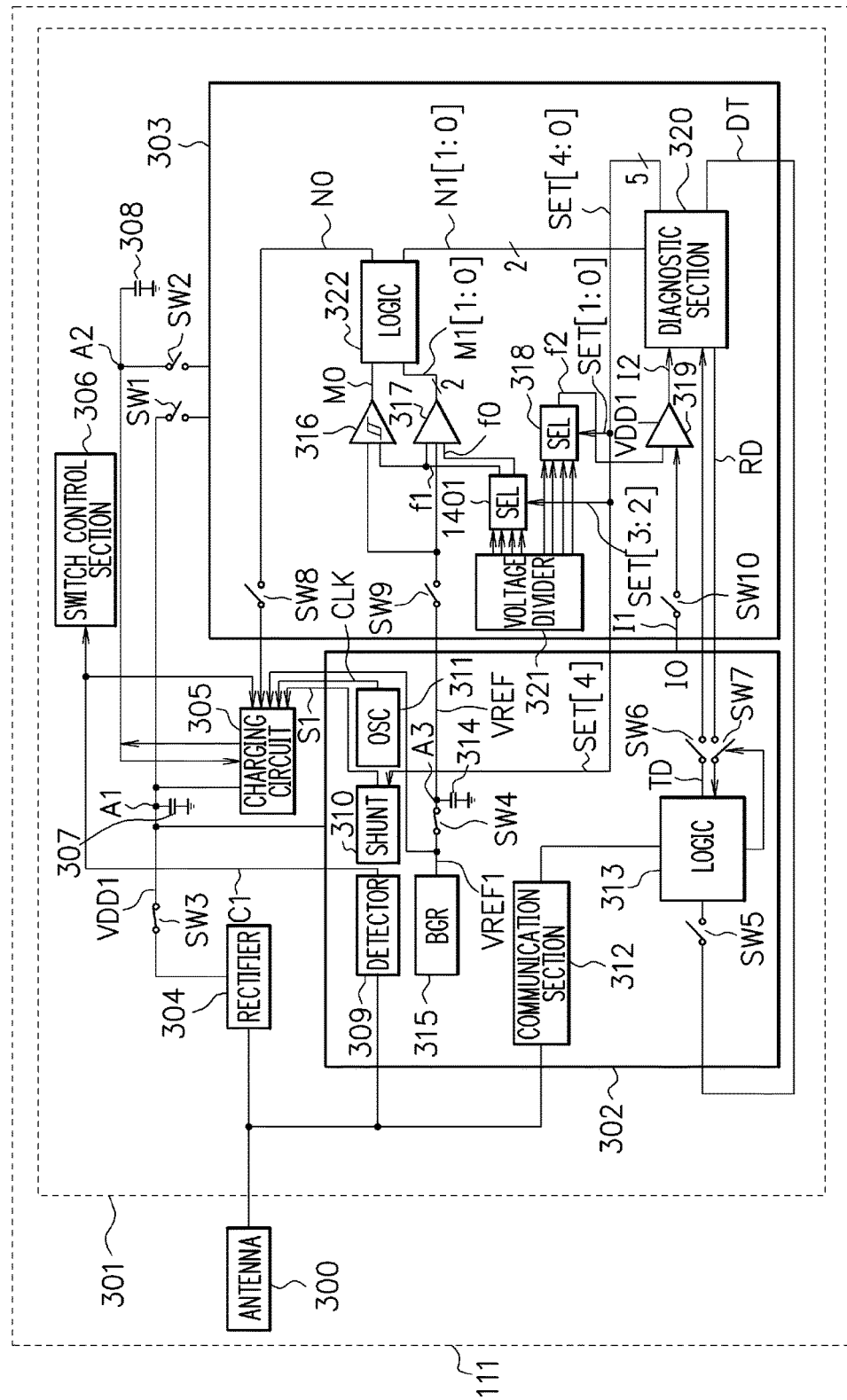
FIG. 14 is a diagram illustrating a configuration example of a radio tag according to a third embodiment.

FIG. 14 is a diagram illustrating a configuration example of the radio tag 111 according to a third embodiment. The radio tag 111 (FIG. 14) according 2 to the present embodiment corresponds to the radio tag 111 (FIG. 3) of the first embodiment to which a selector 1401 is added. Hereinafter, differences of the present embodiment from the first embodiment will be described.

The diagnostic section 320 outputs a 5-bit signal SET [4:0]. Of the 5-bit signal SET [4:0], a 2-bit signal SET [1:0] is outputted to the selector 318 as in the case of the first embodiment. Of the 5-bit signal SET [4:0], a 2-bit signal SET [3:2] is outputted to the selector 1401 and a 1-bit signal SET [4] is outputted to the shunt circuit 310.

The voltage divider 321 outputs a plurality of voltages to the selector 1401. The selector 1401 assumes voltages selected from among the plurality of voltages in accordance with the signal SET [3:2] as voltages f0 and f1, and outputs the voltage f1 to the comparator 316 and outputs the voltage f0 and f1 to the comparator 317. The logic circuit 322 outputs a 2-bit signal N1 [1:0] to the diagnostic section 320.

FIG. 15 is a diagram illustrating operation of the logic circuit 322 in FIG. 14. Hereinafter, differences of FIG. 15 from FIG. 8 will be described. When the first supply voltage VDD1 is 1.8 V, the voltage f0 is 0.99 V and the voltage f1 is 1.01 V. In that case, since the voltage f0 is lower than the reference voltage VREF (1.0 V) and the voltage f1 is higher than the reference voltage VREF (1.0 V), a signal M1 [1:0] becomes "01." When the signal M1 [1:0] is "01," the logic circuit 322 outputs a signal N1 [1:0] of "11" to the diagnostic section 320. When the signal N1[1:0] is "11," the diagnostic section 320 is enabled to operate because the first supply voltage VDD1 is approximately 1.8 V and outputs a low-level signal SET [4] to the shunt circuit 310. Then, the shunt circuit 310 outputs a low-level control signal S1 indicating that the shunt function is disabled.

When the first supply voltage VDD1 is lower than 1.8 V and the voltage f1 is lower than the reference voltage VREF (1.0 V), the signal M1 [1:0] becomes "00." When the signal M1 [1:0] is "00," the logic circuit 322 outputs a signal N1 [1:0] of "00" to the diagnostic section 320. When the signal N1 [1:0] is "00," since the first supply voltage VDD1 is lower than an operable voltage range, the diagnostic section 320 is disabled to operate and outputs a low-level signal SET [4] to the shunt circuit 310. The shunt circuit 310 then outputs a low-level control signal S1 indicating that the shunt function is disabled.

When the first supply voltage VDD1 is higher than 1.8 V and the voltage f0 is higher than the reference voltage VREF (1.0 V), the signal M1[1:0] becomes "10." When the signal M1 [1:0] is "10," the logic circuit 322 outputs a signal N1 [1:0] of "01" to the diagnostic section 320. When the signal N1 [1:0] is "01," since the first supply voltage VDD1 is higher than the operable voltage range, the diagnostic section 320 is disabled to operate and outputs a high-level signal SET [4] to the shunt circuit 310. Then, the shunt circuit 310 outputs a high-level control signal S1 indicating that the shunt function is enabled. The charge of the capacitor 307 is thereby discharged, causing the first supply voltage VDD1 to decrease.

FIG. 16 is a diagram for describing a method for the self-diagnostic circuit 303 to make a diagnosis on diagnostic items. Hereinafter, differences of FIG. 16 from FIG. 6 will be described. For a period of not performing radio communication after the radio communication period B1, a process S602 is performed. In the process S602, four diagnoses H1 to H4 are made. First, the diagnostic section 320 makes a diagnosis H1 and writes the diagnostic result to the diagnostic result memory 703. Next, the diagnostic section 320 makes a diagnosis H2 and writes the diagnostic result to the diagnostic result memory 703. Next, the diagnostic section 320 makes a diagnosis H3 and writes the diagnostic result to the diagnostic result memory 703. Next, the diagnostic section 320 makes a diagnosis H4 and writes the diagnostic result to the diagnostic result memory 703.

The diagnosis H1 is a diagnosis on a diagnostic item n-3 and is a memory write and read diagnosis when the first supply voltage VDD1 is a normal voltage 1.8 V. The diagnosis H2 is a diagnosis on a diagnostic item n-2 and is a memory write and read diagnosis when the first supply voltage VDD1 is a low voltage 1.6 V. The diagnosis H3 is a diagnosis on a diagnostic item n-1 and is a memory write and read diagnosis when the first supply voltage VDD1 is a low voltage 1.4 V. The diagnosis H4 is a diagnosis on a diagnostic item n and is a memory write and read diagnosis when the first supply voltage VDD1 is a low voltage 1.2 V. The diagnoses H1 to H4 on four diagnostic items are made within one cycle. For a period of not performing radio communication, the self-diagnostic circuit 303 consecutively makes diagnoses on a plurality of diagnostic items corresponding to a plurality of voltage states respectively.

The diagnoses H1 to H4 are diagnoses for checking a low-limit operating voltage of the memory, and when the first supply voltage VDD1 falls below a certain voltage, normal memory write and read can no longer be performed. For example, when the first supply voltage VDD1 is a low voltage of 1.4 V, it is possible to perform memory read but not memory write. When the first supply voltage VDD1 further falls down to 1.2 V, it is not possible to perform memory read either.

FIG. 17 is a diagram illustrating a time variation of the first supply voltage VDD1. When the reader writer 110 starts radio transmission to the radio tag 111, the first supply voltage VDD1 increases from 0 V to 1.8 V. At time t11, the first supply voltage VDD1 becomes 1.8 V, the radio tag 111 is activated and a radio communication period starts.

Next, at time t12, when the reader writer 110 ends radio communication to the radio tag 111, the radio communication period ends and a period of not performing radio communication starts. Then, the self-diagnostic circuit 303 is activated, the self-diagnostic circuit 303 makes the diagnosis H1 of 1.8 V in FIG. 16 and writes the diagnostic result to the diagnostic result memory 703.

Next, at time t13, the selector 1401 changes the selection of the voltages f0 and f1 to change the diagnosis H1 of 1.8 V to the diagnosis H2 of 1.6 V. The first supply voltage VDD1 is controlled to 1.6 V by the shunt circuit 310 and the charging circuit 305.

Next, at time t14, the first supply voltage VDD1 becomes 1.6 V. The self-diagnostic circuit 303 makes the diagnosis H2 of 1.6 V in FIG. 16 and writes the diagnostic result to the diagnostic result memory 703.

Next, at time t15, the selector 1401 changes the selection of the voltages f0 and f1 to change the diagnosis H2 of 1.6 V to the diagnosis H3 of 1.4 V. The first supply voltage VDD1 is controlled to 1.4 V by the shunt circuit 310 and the charging circuit 305.

Next, at time t16, the first supply voltage VDD1 is 1.4 V. The self-diagnostic circuit 303 makes the diagnosis H3 of 1.4 V in FIG. 16 and writes the diagnostic result to the diagnostic result memory 703.

Next, at time t17, the selector 1401 changes the selection of the voltages f0 and f1 to change the diagnosis H3 of 1.4 V to the diagnosis H4 of 1.2 V. The first supply voltage VDD1 is controlled to 1.2 V by the shunt circuit 310 and charging circuit 305.

Next, at time t18, the first supply voltage VDD1 becomes 1.2 V. The self-diagnostic circuit 303 makes the diagnosis H4 of 1.2 V in FIG. 16 and writes the diagnostic result to the diagnostic result memory 703.

Figure 18A:
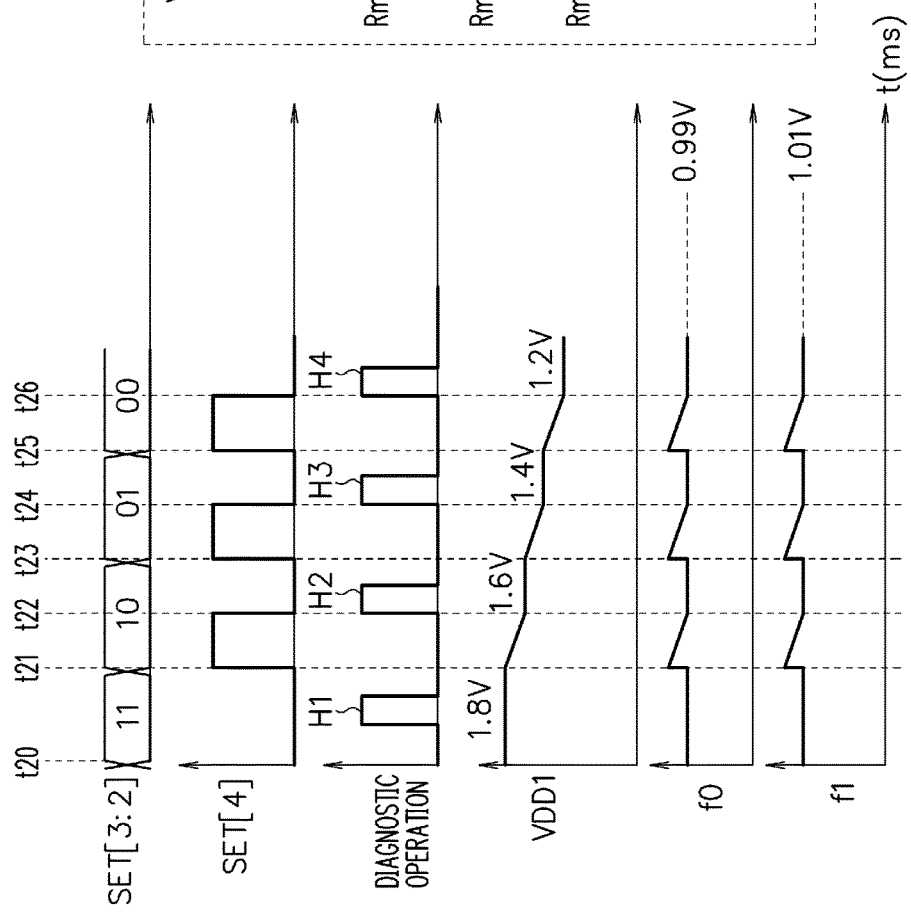
FIG. 18A is a diagram for describing operation of the radio tag.
Figure 18B:
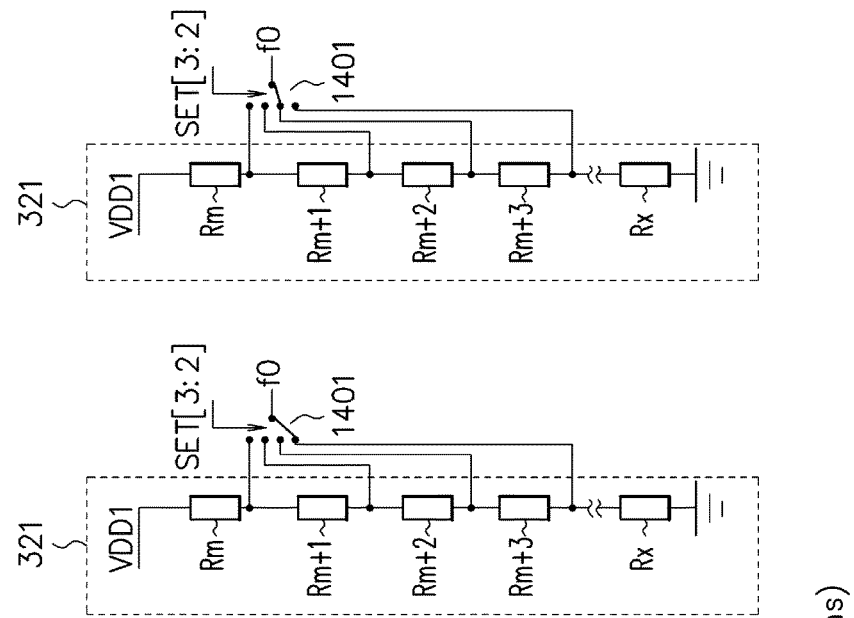
FIGS. 18B and 18C are diagrams illustrating configuration examples of a voltage divider and a selector.
Figure 18C:
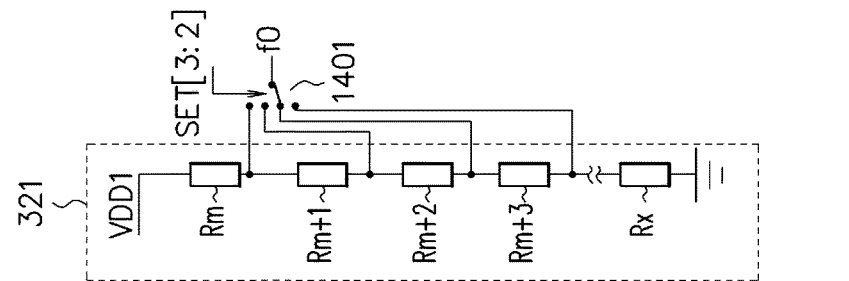

FIG. 18A is a diagram for describing operation of the radio tag 111 and FIGS. 18B and 18C are diagrams illustrating configuration examples of the voltage divider 321 and the selector 1401. The voltage divider 321 includes a series connection circuit of resistors Rm to Rx connected between the node of the first supply voltage VDD1 and the ground potential node. Note that although the selector of voltage f0 is shown as an example of the selector 1401, the selector 1401 also includes the selector of voltage f1 likewise.

Time t20 corresponds to time t12 in FIG. 17. At time t20, a signal SET [3:2] becomes "11." Then, the selector 1401 outputs the voltage at a lower terminal of a resistor Rm+3 as the voltage f0 as shown in FIG. 18B. The same applies to the voltage f1. Then, the voltage f0 becomes 0.99 V and the voltage f1 becomes 1.01 V. Since the signal SET [4] is at low level, no shunt operation is performed and the first supply voltage VDD1 is kept to 1.8 V. The self-diagnostic circuit 303 makes the diagnosis H1 of 1.8 V and writes the diagnostic result to the diagnostic result memory 703.

Next, time t21 corresponds to time t13 in FIG. 17. At time t21, a signal SET [3:2] becomes "10." Then, the selector 1401 outputs the voltage at a lower terminal of a resistor Rm+2 as the voltage f0 as shown in FIG. 18C. The same applies to the voltage f1. Then, the voltage f0 increases from 0.99 V to 1.11 V and the voltage f1 increases from 1.01 V to 1.14 V. The signal SET [4] becomes high level, the shunt operation is performed, the charge of the capacitor 307 is discharged, the first supply voltage VDD1 decreases from 1.8 V to 1.6 V, the voltage f0 decreases from 1.11 V to 0.99 V and the voltage f1 decreases from 1.14 V to 1.01 V.

Next, time t22 corresponds to time t14 in FIG. 17. At time t22, the signal SET [4] becomes low level, the shunt operation is stopped, the first supply voltage VDD1 is kept to 1.6 V, the voltage f0 is kept to 0.99 V and the voltage f1 is kept to 1.01 V. The self-diagnostic circuit 303 makes the diagnosis H2 of 1.6 V and writes the diagnostic result to the diagnostic result memory 703.

Next, time t23 corresponds to time t15 in FIG. 17. At time t23, the signal SET [3:2] becomes "01." Then, the selector 1401 outputs the voltage at a lower terminal of a resistor Rm+1 as the voltage f0. The same applies to the voltage f1. Then, the voltage f0 increases from 0.99 V to 1.11 V and the voltage f1 increases from 1.01 V to 1.14 V. The signal SET [4] becomes high level, the shunt operation is performed, the charge of the capacitor 307 is discharged, the first supply voltage VDD1 decreases from 1.6 V to 1.4 V, the voltage f0 decreases from 1.11 V to 0.99 V and the voltage f1 decreases from 1.14 V to 1.01 V.

Next, time t24 corresponds to time t16 in FIG. 17. At time t24, the signal SET [4] becomes low level, the shunt operation is stopped, the first supply voltage VDD1 is kept to 1.4 V, the voltage f0 is kept to 0.99 V and the voltage f1 is kept to 1.01 V. The self-diagnostic circuit 303 makes the diagnosis H3 of 1.4 V and writes the diagnostic result to the diagnostic result memory 703.

Next, time t25 corresponds to time t17 in FIG. 17. At time t25, the signal SET [3:2] becomes "00." Then, the selector 1401 outputs the voltage at a lower terminal of a resistor Rm as the voltage f0. The same applies to the voltage f1. Then, the voltage f0 increases from 0.99 V to 1.11 V and the voltage f1 increases from 1.01 V to 1.14 V. The signal SET [4] becomes high level, the shunt operation is performed, the charge of the capacitor 307 is discharged, the first supply voltage VDD1 decreases from 1.4 V to 1.2 V, the voltage f0 decreases from 1.11 V to 0.99 V and the voltage f1 decreases from 1.14 V to 1.01 V.

Next, time t26 corresponds to time t18 in FIG. 17. At time t26, the signal SET [4] becomes low level, the shunt operation is stopped, the first supply voltage VDD1 is kept to 1.2 V, the voltage f0 is kept to 0.99 V, the voltage f1 is kept to 1.01 V. The self-diagnostic circuit 303 makes the diagnosis H4 of 1.2 V and writes the diagnostic result to the diagnostic result memory 703.

Figure 19:
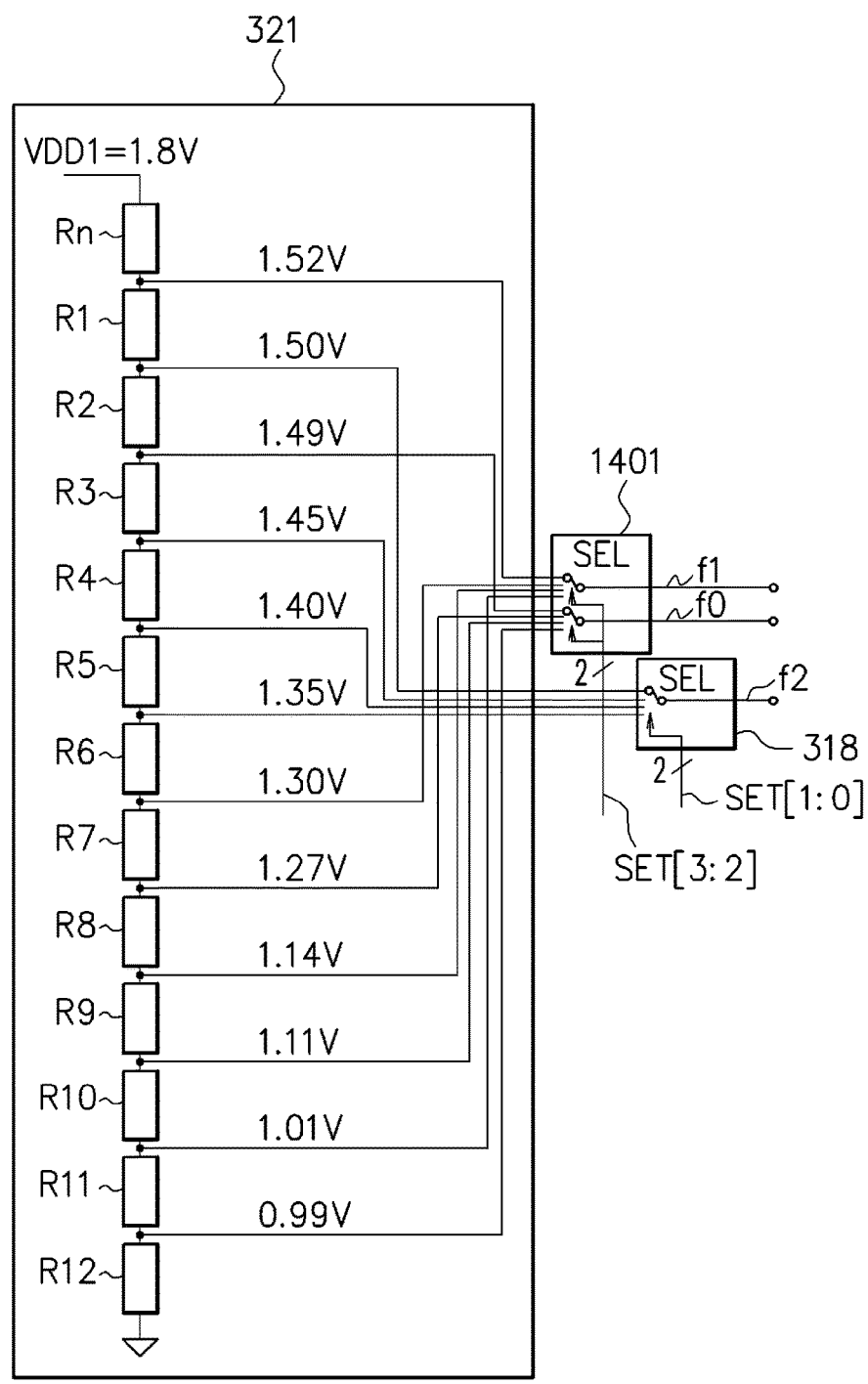
FIG. 19 is a diagram illustrating another configuration example of the voltage divider and the selector.

FIG. 19 is a diagram illustrating another configuration example of the voltage divider 321, and the selectors 318 and 1401. The voltage divider 321 includes resistors Rn and R1 to R12 connected in series between the node of the first supply voltage VDD1 and the ground potential node and generates voltages of 1.52 V, 1.50 V, 1.49 V, 1.45 V, 1.40 V, 1.35 V, 1.30 V, 1.27 V, 1.14 V, 1.11 V, 1.01 V and 0.99 V, for example. The selector 318 outputs any one of voltages at lower terminals of resistors R1, R3, R4 and R5 as the voltage f2 in accordance with the signal SET [1:0]. The selector 1401 outputs any one of voltages at lower terminals of resistors Rn, R6, R8 and R70 as the voltage f1 in accordance with the signal SET [3:2]. Furthermore, the selector 1401 outputs any one of voltages at lower terminals of resistors R2, R7, R9 and R11 as the voltage f0 in accordance with the signal SET [3:2].

According to the present embodiment, it is possible to make a diagnosis to check a low-limit operating voltage of the memory. When the first supply voltage VDD1 falls below a certain voltage, normal write and read can no longer be performed. For example, in the case of a specification in which a minimum voltage at which memory read can be done is 1.2 V, memory read can be done but memory write cannot be done when the first supply voltage VDD1 is a low voltage of 1.4 V. When the first supply voltage VDD1 falls below 1.2 V, memory read cannot be done. The radio tag 111 can make a diagnostic based on this.

Note that an example has been described above where only the memory in the processing circuit 302 is written and read, but when the low-limit operating voltages of the logic section and the analog section are lower than that of the memory, if the second and third embodiments are combined, it is possible to efficiently make a diagnosis on a plurality of diagnostic items within one cycle by combining diagnostic items of the logic section and the analog section of different operating voltages.

In the first to third embodiments, the rectifier 304 and the charging circuit 305 store charge for causing the self-diagnostic circuit 303 to operate for a period of performing radio communication. The self-diagnostic circuit 303 makes a diagnosis using the above-described stored charge on some of the plurality of diagnostic items for a period of not performing radio communication.

Furthermore, the self-diagnostic circuit 303 makes a diagnosis on some of the plurality of diagnostic items for a period of not performing radio communication, then makes a diagnosis on some other diagnostic items or all the other diagnostic items for a period of not performing radio communication after performing radio communication.

All the above-described embodiments have been presented as no more than examples of embodiment in implementing the present invention, and the technical scope of the present invention should not thereby be interpreted restrictively. That is, the present invention can be implemented in various forms without departing from the technical idea or main features thereof.

Making a diagnosis of the processing circuit for a period of not performing radio communication makes it possible to reduce power consumption during radio communication and diagnose the processing circuit with high accuracy.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An integrated circuit that performs radio communication with an external apparatus by transmission or reception of a carrier, the integrated circuit comprising:
   a processing circuit;
   a diagnostic circuit configured to perform a diagnosis of the processing circuit according to a plurality of diagnostic items;
   a detector configured to detect a radio signal level; and
   a charging circuit configured to store charge for causing the diagnostic circuit to operate, during a period that the detector detects that the radio signal level is a first logic level,
   wherein the diagnostic circuit is configured to perform the diagnosis on a first subset of the plurality of diagnostic items by using the charge stored in the charging circuit during a first period that the detector detects that the radio signal level is a second logic level which differs from the first logic level.

2. The integrated circuit according to claim 1, wherein the integrated circuit is incorporated in a radio tag.

3. The integrated circuit according to claim 1, wherein setting information indicating the diagnostic items is stored in the diagnostic circuit.

4. The integrated circuit according to claim 3, wherein the diagnostic items of the setting information are selected according to a value of a counter incorporated in the diagnostic circuit.

5. The integrated circuit according to claim 1, wherein the diagnostic circuit is configured to perform the diagnosis on the first subset of the plurality of diagnostic items during the first period that the detector detects that the radio signal level is the second logic level which differs from the first logic level and then perform the diagnosis on a second subset or all the remaining diagnostic items of the plurality of diagnostic items during a second period that the detector detects that the radio signal level is the second logic level which differs from the first logic level after the first period.

6. The integrated circuit according to claim 1, wherein the charging circuit comprises:
   a first charging circuit configured to charge a first capacitor to generate a first voltage; and
   a second charging circuit configured to charge a second capacitor to generate a second voltage which is higher than the first voltage.

7. The integrated circuit according to claim 6, wherein the first voltage is an operating voltage of the processing circuit.

8. The integrated circuit according to claim 6, wherein the second charging circuit charges the first capacitor based on the second voltage when the first voltage is smaller than a first value and charges the second capacitor based on the first voltage when the first voltage is larger than the first value.

9. The integrated circuit according to claim 1, wherein the diagnostic circuit comprises a memory configured to store a result of the diagnosis.

10. The integrated circuit according to claim 9, further comprising a communication circuit configured to transmit the result of the diagnosis to the external apparatus during a period of performing transmission of the carrier subsequent to the first period.

11. The integrated circuit according to claim 1, wherein the diagnostic circuit is configured to perform the diagnosis on a plurality of diagnostic items corresponding to a plurality of voltage states for a single period that the detector detects that the radio signal level is the second logic level which differs from the first logic level.

12. The integrated circuit according to claim 11, wherein the diagnostic circuit is configured to consecutively perform the diagnosis on the plurality of diagnostic items corresponding to the plurality of voltage states.

13. A diagnostic system comprising:
   an external apparatus; and
   an integrated circuit configured to perform radio communication with the external apparatus by transmission or reception of a carrier, the integrated circuit comprising:
      a processing circuit;
      a diagnostic circuit configured to perform a diagnosis of the processing circuit according to a plurality of diagnostic items;
      a detector configured to detect a radio signal level; and
      a charging circuit configured to store charge for causing the diagnostic circuit to operate, during a period that the detector detects that the radio signal level is a first logic level,
   wherein the diagnostic circuit is configured to perform the diagnosis on a first subset of the plurality of diagnostic items by using the charge stored in the charging circuit during a first period that the detector detects that the radio signal level is a second logic level which differs from the first logic level.

14. The diagnostic system according to claim 13, wherein the diagnostic circuit is configured to perform the diagnosis on the first subset of the plurality of diagnostic items during the first period that the detector detects that the radio signal level is the second logic level which differs from the first logic level and then perform the diagnosis on a second subset or all the remaining diagnostic items of the plurality of diagnostic items during a second period that the detector detects that the radio signal level is the second logic level which differs from the first logic level after the first period.

15. The diagnostic system according to claim 13, wherein the charging circuit comprises:
   a first charging circuit configured to charge a first capacitor to generate a first voltage; and
   a second charging circuit configured to charge a second capacitor to generate a second voltage which is higher than the first voltage.

16. The diagnostic system according to claim 13,
   wherein the diagnostic circuit comprises a memory configured to store a result of the diagnosis, and
   the integrated circuit further includes a communication circuit configured to transmit the result of the diagnosis to the external apparatus during a period of performing transmission of the carrier subsequent to the first period.

17. A diagnostic method comprising:
   detecting a radio signal level in a detector;
   storing charge in a charging circuit for a period when the detector detects that the radio signal level is a first logic level
   performing a diagnosis of a processing circuit according to a subset of a plurality of diagnostic items by using the charge stored in the charging circuit during a first period of detecting a radio signal level is a second logic level which differs from the first logic level.

18. The diagnostic method according to claim 17, wherein a result of the diagnosis is stored in a memory.

19. The diagnostic method according to claim 18, wherein the result of the diagnosis is transmitted to the external apparatus during a period of performing transmission of the carrier subsequent to the first period.

* * * * *